(12) United States Patent
Lung

(10) Patent No.: US 10,454,389 B1
(45) Date of Patent: Oct. 22, 2019

(54) POWER CONVERSION DEVICE

(71) Applicant: TDK CORPORATION, Tokyo (JP)

(72) Inventor: Chienru Lung, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 16/364,745

(22) Filed: Mar. 26, 2019

(30) Foreign Application Priority Data

Mar. 28, 2018 (JP) ................................ 2018-062908

(51) Int. Cl.
*H02M 7/5387* (2007.01)
*H02M 1/08* (2006.01)
*H03H 7/06* (2006.01)

(52) U.S. Cl.
CPC ......... *H02M 7/53871* (2013.01); *H02M 1/08* (2013.01); *H02M 7/53873* (2013.01); *H02M 7/5387* (2013.01); *H03H 7/06* (2013.01)

(58) Field of Classification Search
CPC .. H02M 7/53873; H02M 1/08; H02M 7/5387; H03H 7/06
See application file for complete search history.

(56) References Cited

U.S. PATENT DOCUMENTS

| | | | |
|---|---|---|---|
| 5,852,558 A * | 12/1998 | Julian | H02M 1/12 363/132 |
| 9,083,200 B2 * | 7/2015 | Tsai | H02J 9/062 |
| 9,413,224 B2 * | 8/2016 | Kouno | H02M 1/36 |
| 10,236,793 B2 * | 3/2019 | Lung | G05F 1/67 |
| 2015/0123579 A1 * | 5/2015 | Liu | H02M 1/126 318/400.05 |

FOREIGN PATENT DOCUMENTS

| JP | 2015-002657 A | 1/2015 |
|---|---|---|
| JP | 2015-231259 A | 12/2015 |
| JP | 2017-208932 A | 11/2017 |

OTHER PUBLICATIONS

Lung, Chienru et al. "Implementation of Sigma-Delta Modulation Controller for Single-Phase Three-Wire Inverter in Stand-Alone Operation Applied for Hybrid Generation System for Residential Houses".IEEE 10th International Conference on Power Electronics and Drive Systems (PEDS), pp. 680-685, 2013.

* cited by examiner

*Primary Examiner* — Kyle J Moody
(74) *Attorney, Agent, or Firm* — Oliff PLC

(57) ABSTRACT

A power conversion device according to an embodiment of the disclosure includes: first, second, third, fourth, fifth, and sixth elements coupling, respectively, a first voltage line to a first node, a second voltage line to the first node, the first voltage line to a second node, the second voltage line to the second node, the first voltage line to a third node, and the second voltage line to the third node; a low-pass filter including two or more reactors provided in respective two or more paths of first, second, and third paths, respectively, coupling the first node and a first output terminal, coupling the second node and a second output terminal, and coupling the third node and a third output terminal, and first and second capacitors; and a control section calculating voltage differences across the respective two or more reactors to control operations of the fifth and sixth elements.

11 Claims, 15 Drawing Sheets

| Symbol | Parameter | Symbol | Parameter |
|---|---|---|---|
| Vdc | 400V | Cu, Cw | 27 $\mu$F |
| Cdc | 3000 $\mu$F | Rcu, Rcw | 6m$\Omega$ |
| Lu, Lw | 200 $\mu$H | Emax | 340V |
| Ru, Rw | 5m$\Omega$ | Z1 | 5$\Omega$ |
| Z2 | 5$\Omega$ | fs | 20kHz |
| Td | 2$\mu$s | fsd | 60Hz |
| Lo | 0H | Ro | 0$\Omega$ |

FIG. 8

POWER CONVERSION DEVICE

CROSS REFERENCE TO RELATED APPLICATIONS

This application claims the benefit of Japanese Priority Patent Application No. 2018-062908 filed on Mar. 28, 2018, the entire contents of which are incorporated herein by reference.

BACKGROUND

The disclosure relates to a power conversion device that converts DC power to AC power.

In a case, for example, where power is supplied to a home electronic apparatus, a power conversion device of a single-phase three-wire system is often utilized. The power conversion device of the single-phase three-wire system includes two voltage lines that transmit respective two AC voltages having different phases, and one neutral line that transmits a neutral point voltage. The power conversion device of the single-phase three-wire system is disclosed, for example, in Japanese Unexamined Patent Application Publications No. 2015-231259, No. 2017-208932, and No. 2015-2657, and in Chienru Lung, Hiroaki Kakigano, Yushi Miura, and Toshifumi Ise, "Implementation of sigma-delta modulation controller for single-phase three-wire inverter in stand-alone operation applied for hybrid generation system for residential house", 2013 IEEE 10th International Conference on Power Electronics and Drive Systems (PEDS), pp. 680-685.

SUMMARY

A power conversion device according to one embodiment of the disclosure includes a first switching element, a second switching element, a third switching element, a fourth switching element, a fifth switching element, a sixth switching element, a first output terminal, a second output terminal, a third output terminal, a low-pass filter, and a control section. The first switching element is configured to couple a first voltage line to a first node. The second switching element is configured to couple a second voltage line to the first node. The third switching element is configured to couple the first voltage line to a second node. The fourth switching element is configured to couple the second voltage line to the second node. The fifth switching element is configured to couple the first voltage line to a third node. The sixth switching element is configured to couple the second voltage line to the third node. The low-pass filter includes two or more reactors, a first capacitor, and a second capacitor. The two or more reactors are provided in respective two or more paths out of a first path, a second path, and a third path. The first path couples the first node and the first output terminal. The second path couples the second node and the second output terminal. The third path couples the third node and the third output terminal. The first capacitor is provided between the first path and the third path. The second capacitor is provided between the second path and the third path. The control section is configured to calculate two or more voltage differences across the respective two or more reactors on the basis of currents flowing to the respective two or more reactors. The control section is configured to control operations of the fifth switching element and the sixth switching element on the basis of the two or more voltage differences, a first voltage at the first output terminal, and a second voltage at the second output terminal.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

FIG. 8 is a table indicating simulation conditions.

DETAILED DESCRIPTION

Figure 1:
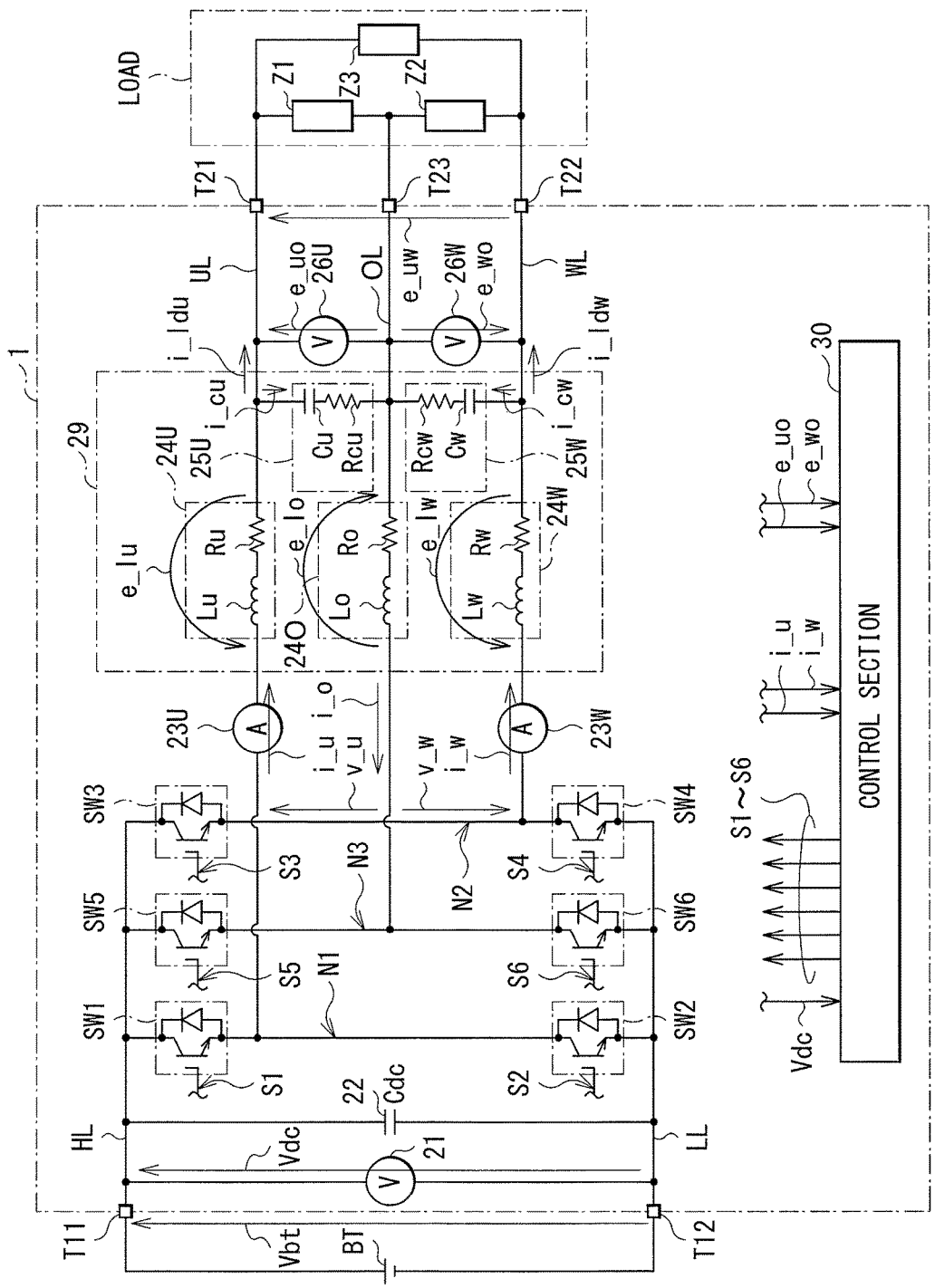
FIG. 1 is a circuit diagram illustrating a configuration example of a power conversion device according to one example embodiment of the disclosure.

Some embodiments of the disclosure are described below in detail with reference to the accompanying drawings.

It has been desired, for a power conversion device, to suppress fluctuation of an AC output voltage in a case where a load state suddenly changes, for example.

It is desirable to provide a power conversion device that makes it possible to suppress fluctuation of an AC output voltage.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail.

Configuration Example

FIG. 1 illustrates a configuration example of a power conversion device (a power conversion device 1) according to an example embodiment of the disclosure. The power conversion device 1 may be a full-bridge DC/AC inverter of a single-phase three-wire system. The power conversion device 1 may include terminals T11 and T12 and terminals T21 and T22. A battery BT may be coupled to each of the terminals T11 and T12. The battery BT may be, for example, a home battery or a battery for an electric vehicle. A battery voltage Vbt in the battery BT may be set to about 400 V, for example. The terminals T21 and T22 and a terminal T23 may be each coupled to a load device LOAD.

The power conversion device 1 may include a voltage detection section 21, a capacitor 22, switching elements SW1 to SW6, current detection sections 23U and 23W, a low-pass filter 29, voltage detection sections 26U and 26W, and a control section 30.

The voltage detection section 21 may detect the DC bus voltage Vdc. The voltage detection section 21 has one end that may be coupled to a high-voltage line HL guided by the terminal T11 and the other end that may be coupled to a low-voltage line LL guided by the terminal T12. The voltage detection section 21 may detect, as the DC bus voltage Vdc, a voltage in the high-voltage line HL as viewed from a voltage in the low-voltage line LL. The voltage detection section 21 may supply the control section 30 with information about the detected DC bus voltage Vdc.

The capacitor 22 has one end that may be coupled to the high-voltage line HL and the other end that may be coupled to the low-voltage line LL. The capacitor 22 may be configured by an electrolytic capacitor, for example. The capacitor 22 may have a capacitance Cdc.

The switching elements SW1 to SW6 may perform switching operations on the basis of gate signals S1 to S6, respectively. The switching elements SW1 to SW6 may be each configured by an insulated gate bipolar transistor (IGBT), for example. The switching elements SW1 to SW6 may each include a free-wheeling diode. The free-wheeling diode of the switching element SW1 has an anode that may be coupled to an emitter of the switching element SW1 and a cathode that may be coupled to a collector of the switching element SW1. The same holds true also for the switching elements SW2 to SW6.

The switching element SW1 is brought into an ON state to thereby couple the high-voltage line HL to a node N1. The switching element SW1 has: the collector that may be coupled to the high-voltage line HL; a gate that may be supplied with the gate signal S1; and the emitter that may be coupled to the node N1. The switching element SW2 is brought into an ON state to thereby couple the low-voltage line LL to the node N1. The switching element SW2 has: a collector that may be coupled to the node N1; a gate that may be supplied with the gate signal S2; and an emitter that may be coupled to the low-voltage line LL. The node N1 may be a coupling point between the emitter of the switching element SW1 and the collector of the switching element SW2.

The switching element SW3 is brought into an ON state to thereby couple the high-voltage line HL to a node N2. The switching element SW3 has: a collector that may be coupled to the high-voltage line HL; a gate that may be supplied with the gate signal S3; and an emitter that may be coupled to the node N2. The switching element SW4 is brought into an ON state to thereby couple the low-voltage line LL to the node N2. The switching element SW4 has: a collector that may be coupled to the node N2; a gate that may be supplied with the gate signal S4; and an emitter that may be coupled to the low-voltage line LL. The node N2 may be a coupling point between the emitter of the switching element SW3 and the collector of the switching element SW4.

The switching element SW5 is brought into an ON state to thereby couple the high-voltage line HL to a node N3. The switching element SW5 has: a collector that may be coupled to the high-voltage line HL; a gate that may be supplied with the gate signal S5; and an emitter that may be coupled to the node N3. The switching element SW6 is brought into an ON state to thereby couple the low-voltage line LL to the node N3. The switching element SW6 has: a collector that may be coupled to the node N3; a gate that may be supplied with the gate signal S6; and an emitter that may be coupled to the low-voltage line LL. The node N3 may be a coupling point between the emitter of the switching element SW5 and the collector of the switching element SW6.

A path from the node N1 to the terminal T21 may be provided with the current detection section 23U. A path from the node N2 to the terminal T22 may be provided with the current detection section 23W.

The current detection section 23U may detect a current i_u flowing from the node N1 to the low-pass filter 29. The current detection section 23U has one end that may be coupled to the node N1 and the other end that may be coupled to the low-pass filter 29. The current detection section 23U may supply the control section 30 with information about the detected current i_u.

The current detection section 23W may detect a current i_w flowing from the node N2 to the low-pass filter 29. The current detection section 23W has one end that may be coupled to the node N2 and the other end that may be coupled to the low-pass filter 29. The current detection section 23W may supply the control section 30 with information about the detected current i_w.

The low-pass filter 29 may remove a high-frequency component included in a voltage difference between a voltage at the node N1 and a voltage at the node N3, and may remove a high-frequency component included in a voltage difference between a voltage at the node N2 and the voltage at the node N3. The low-pass filter 29 may include AC reactors 24U, 24W, and 24O, and capacitors 25U and 25W.

The AC reactor 24U has one end that may be coupled to the other end of the current detection section 23U and the other end that may be coupled to a U-phase voltage line UL. The AC reactor 24U may have an inductance Lu and an internal resistance value Ru.

The AC reactor 24W has one end that may be coupled to the other end of the current detection section 23W and the other end that may be coupled to a W-phase voltage line WL. The AC reactor 24W may have an inductance Lw and an internal resistance value Rw.

The AC reactor 24O has one end that may be coupled to the node N3 and the other end that may be coupled to a neutral line OL. The AC reactor 24O may have an inductance Lo and an internal resistance value Ro.

The inductances Lu, Lw, and Lo may be equal to one another; one or more of the inductances Lu, Lw, and Lo may be different from one another. Likewise, the internal resistance values Ru, Rw, and Ro may be equal to one another; one or more of the internal resistance values Ru, Rw, and Ro may be different from one another. Although, in this example, three AC reactors 24U, 24W, and 24O are provided, this is not limitative; one of the three AC reactors 24U, 24W, and 24O may be omitted as described later.

The capacitor 25U has one end that may be coupled to the U-phase voltage line UL and the other end that may be coupled to the neutral line OL. The capacitor 25U may be configured by a film capacitor, for example. The capacitor 25U may have a capacitance Cu and an internal resistance value Rcu.

The capacitor 25W has one end that may be coupled to the W-phase voltage line WL and the other end that may be coupled to the neutral line OL. The capacitor 25W may be configured by a film capacitor, for example. The capacitor 25W may have a capacitance Cw and an internal resistance value Rcw.

This configuration allows the low-pass filter 29, for example, to output a U-phase AC voltage having a sine waveform to the U-phase voltage line UL, and to output a W-phase AC voltage having a sine waveform to the W-phase voltage line WL.

The voltage detection section 26U may detect a voltage e_uo of the U-phase AC voltage to be outputted from the low-pass filter 29. The voltage detection section 26U has one end that may be coupled to the U-phase voltage line UL and the other end that may be coupled to the neutral line OL. The voltage detection section 26U may detect, as the voltage e_uo, a voltage in the U-phase voltage line UL as viewed from a voltage in the neutral line OL. The voltage detection section 26U may supply the control section 30 with information about the detected voltage e_uo.

The voltage detection section 26W may detect a voltage e_wo of the W-phase AC voltage to be outputted from the low-pass filter 29. The voltage detection section 26W has one end that may be coupled to the W-phase voltage line WL and the other end that may be coupled to the neutral line OL. The voltage detection section 26W may detect, as the voltage e_wo, a voltage in the W-phase voltage line WL as viewed from the voltage in the neutral line OL. The voltage detection section 26W may supply the control section 30 with information about the detected voltage e_wo.

The terminals T21, T22, and T23 may be each coupled to the load device LOAD. The load device LOAD corresponds to one or a plurality of electronic apparatuses in a home or in a vehicle, for example. The load device LOAD may include a load, i.e., a U-phase load having an impedance Z1, a load, i.e., a W-phase load having an impedance Z2, and a load having an impedance Z3. The U-phase load has one end that may be coupled to the terminal T21 and the other end that may be coupled to the terminal T23. The W-phase load has one end that may be coupled to the terminal T22 and the other end that may be coupled to the terminal T23. The load having the impedance Z3 has one end that may be coupled to the terminal T21 and the other end that may be coupled to the terminal T22.

The control section 30 may control operations of the power conversion device 1. The control section 30 may be configured by a microcontroller, for example.

The control section 30 may generate the gate signals S1 to S6 to be supplied, respectively, to the switching elements SW1 to SW6 on the basis of the following information. Non-limiting examples of the information may include the information about the DC bus voltage Vdc supplied from the voltage detection section 21, the information about the currents i_u and i_w supplied, respectively, from the current detection sections 23U and 23W, and the information about the voltages e_uo and e_wo supplied, respectively, from the voltage detection sections 26U and 26W. The control section 30 may perform AD conversion, for example, on the information about the DC bus voltage Vdc supplied from the voltage detection section 21 to thereby determine a digital value indicating the DC bus voltage Vdc and thus to perform the control on the basis of the digital value. The same holds true also for the currents i_u and i_w and the voltages e_uo and e_wo. Hereinafter, the DC bus voltage Vdc, the currents i_u and i_w, and the voltages e_uo and e_wo may be used appropriately as those indicating AD-converted digital values. The switching elements SW1 to SW6 may be turned ON and OFF on the basis of, respectively, the gate signals S1 to S6 generated by the control section 30. For example, the power conversion device 1 may turn the switching elements SW1 to SW4 ON and OFF to thereby perform a constant-voltage-amplitude control to allow a voltage amplitude of the AC output voltage to be a predetermined amplitude. Further, the power conversion device 1 may turn the switching elements SW5 and SW6 ON and OFF to thereby control a voltage of the neutral point, i.e., the neutral line OL to maintain a balance of the voltage at the neutral point.

Next, description is given below of expressions indicating the operations of the power conversion device 1.

$$\left.\begin{array}{l} e\_uw = e\_uo - e\_wo \\ i\_uw = i\_u - i\_w \\ i\_lduw = 1\_ldu - i\_ldw \\ v\_uw = v\_u - v\_w \\ Luw = Lu + Lw \\ Ruw = Ru + Rw \\ Cuw = \dfrac{Cu \cdot Cw}{Cu + Cw} \end{array}\right\} \quad (EQ1)$$

$$i\_o = i\_u + i\_w \quad (EQ2)$$

In Expressions EQ1, the first expression indicates that an AC output voltage e_uw is a difference between the voltage e_uo and the voltage e_wo. The second expression indicates that an AC output current i_uw is a difference between the current i_u and the current i_w. The third expression indicates that an estimated load current difference i_lduw is a difference between an estimated load current i_ldu and an estimated load current i_ldw. As illustrated in FIG. 1, the estimated load current i_ldu may be a current flowing from the low-pass filter 29 toward the terminal T21, and the estimated load current i_ldw may be a current flowing from the low-pass filter 29 toward the terminal T22. The fourth expression indicates that an estimated voltage v_uw is a difference between an estimated voltage v_u and an estimated voltage v_w. As illustrated in FIG. 1, the estimated voltage v_u may be an estimated voltage that corresponds to a voltage between the node N1 and the node N3, and may have a sine waveform. As described later, the estimated voltage v_u may be estimated using a voltage difference e_lu across the AC reactor 24U, the voltage e_uo, and a voltage difference e_lo across the AC reactor 24O. As illustrated in FIG. 1, the estimated voltage v_w may be an estimated voltage that corresponds to a voltage between the node N2 and the node N3, and may have a sine waveform. As described later, the estimated voltage v_w may be estimated using a voltage difference e_lw across the AC reactor 24W, the voltage e_wo, and a voltage difference e_lo across the AC reactor 24O. The fifth expression indicates that an inductance Luw is a sum of the inductance Lu of the AC reactor 24U and the inductance Lw of the AC reactor 24W. The sixth expression indicates that a resistance value Ruw is a sum of the internal resistance value Ru of the AC reactor 24U and the internal resistance value Rw of the AC reactor 24W. The seventh expression indicates that a capacitance Cuw is a parallel capacitance value including the capacitance Cu of the capacitor 25U and the capacitance Cw of the capacitor 25W.

Expression EQ2 indicates that a current i_o is a sum of the current i_u and the current i_w. The current i_o may be a current flowing from the low-pass filter 29 toward the node N3, as illustrated in FIG. 1.

Expressions EQ1, Kirchhoff's voltage law, and Kirchhoff's current law may be used to thereby obtain the following Expressions EQ3.

$$\left.\begin{array}{l} v\_uw = Luw \dfrac{d\ i\_uw}{dt} + Ruw \cdot i\_uw + e\_uw \\ i\_uw = Cuw \dfrac{d\ e\_uw}{dt} + i\_lduw \\ v\_uw = d\_uw \cdot Vdc \end{array}\right\} \quad (EQ3)$$

In Expressions EQ3, the first expression indicates that the estimated voltage v_uw is a sum of a resultant voltage of combined inductance Luw, a resultant voltage of a combined resistance value Ruw, and the AC output voltage e_uw. The second expression indicates that the AC output current i_uw is a sum of a resultant current of a combined capacitance Cuw and the estimated load current difference i_lduw. The third expression indicates that the estimated voltage v_uw is a product of a duty ratio d_uw of the switching elements SW1 to SW4 and the DC bus voltage Vdc.

Further, Expression EQ2 and Kirchhoff's voltage law may be used to thereby obtain the following Expressions EQ4.

$$\left.\begin{array}{l} v\_u = e\_lu + e\_uo + e\_lo \\ v\_w = e\_lw + e\_wo + e\_lo \\ e\_lu = Lu \dfrac{d\ i\_u}{dt} + Ru \cdot i\_u \\ e\_lo = Lo \dfrac{d\ i\_o}{dt} + Ro \cdot i\_o \\ e\_lw = Lw \dfrac{d\ i\_w}{dt} + Rw \cdot i\_w \\ d\_o \cdot Vdc = v\_u + v\_w \end{array}\right\} \quad (EQ4)$$

In Expressions EQ4, the first expression indicates that the estimated voltage v_u is a sum of the voltage difference e_lu across the AC reactor 24U, the voltage e_uo, and the voltage difference e_lo across the AC reactor 24O. The voltage difference e_lu may be a voltage at a terminal, of the AC reactor 24U, on side of the node N1, as viewed from a voltage at a terminal, of the AC reactor 24U, on side of the U-phase voltage line UL. The voltage difference e_lo may be a voltage at a terminal, of the AC reactor 24O, on side of the neutral line OL, as viewed from a voltage at a terminal, of the AC reactor 24O, on side of the node N3. The second expression indicates that the estimated voltage v_w is a sum of the voltage difference e_lw across the AC reactor 24W, the voltage e_wo, and the voltage difference e_lo across the AC reactor 24O. The voltage difference e_lw may be a voltage at a terminal, of the AC reactor 24W, on side of the node N2, as viewed from a voltage at a terminal, of the AC reactor 24W, on side of the W-phase voltage line WL. The third expression indicates that the voltage difference e_lu is a sum of a resultant voltage of the inductance Lu of the AC reactor 24U and a resultant voltage of the internal resistance value Ru of the AC reactor 24U. The fourth expression indicates that the voltage difference e_lo is a sum of a resultant voltage of the inductance Lo of the AC reactor 24O and a resultant voltage of the internal resistance value Ro of the AC reactor 24O. The fifth expression indicates that the voltage difference e_lw is a sum of a resultant voltage of the inductance Lw of the AC reactor 24W and a resultant voltage of the internal resistance value Rw of the AC reactor 24W. The sixth expression indicates that a product of a duty ratio d_o of the switching elements SW5 and SW6 and the DC bus voltage Vdc is a sum of the estimated voltage v_u and the estimated voltage v_w.

In this example, the control section 30 may determine the estimated load currents i_ldu and i_ldw using the following expressions.

$$\left.\begin{array}{l} i\_ldu = i\_u - i\_cu \\ i\_ldw = i\_w - i\_cw \\ i\_cu = \sqrt{2} \cdot Euorms \cdot 2\pi\ fsd \cdot Cu \cdot \sin\!\left(\theta sd + \dfrac{\pi}{2}\right) \\ i\_cw = -\sqrt{2} \cdot Eworms \cdot 2\pi\ fsd \cdot Cw \cdot \sin\!\left(\theta sd + \dfrac{\pi}{2}\right) \end{array}\right\} \quad (EQ5)$$

$$\left.\begin{array}{l} Euorms = \begin{cases} \sqrt{\dfrac{2}{Tsd}\int_0^{\frac{Tsd}{2}}(e\_uo(t))^2\,dt} & \left(0 \leq t < \dfrac{Tsd}{2}\right) \\ \sqrt{\dfrac{2}{Tsd}\int_{\frac{Tsd}{2}}^{Tsd}(e\_uo(t))^2\,dt} & \left(\dfrac{Tsd}{2} \leq t < Tsd\right) \end{cases} \\ Eworms = \begin{cases} \sqrt{\dfrac{2}{Tsd}\int_0^{\frac{Tsd}{2}}(e\_wo(t))^2\,dt} & \left(0 \leq t < \dfrac{Tsd}{2}\right) \\ \sqrt{\dfrac{2}{Tsd}\int_{\frac{Tsd}{2}}^{Tsd}(e\_wo(t))^2\,dt} & \left(\dfrac{Tsd}{2} \leq t < Tsd\right) \end{cases} \end{array}\right. \quad (EQ6)$$

$$Tsd = \dfrac{1}{fsd}$$

In Expressions EQ5, the first expression indicates that the estimated load current i_ldu is a difference between the current i_u and an estimated current i_cu. As illustrated in FIG. 1, the estimated current i_cu may be a current flowing from the U-phase voltage line UL toward the capacitor 25U. The second expression indicates that the estimated load current i_ldw is a difference between the current i_w and an estimated current i_cw. As illustrated in FIG. 1, the estimated current i_cw may be a current flowing from the W-phase voltage line WL toward the capacitor 25W. The third and fourth expressions indicate estimation of the estimated currents i_cu and i_cw, respectively, using sine-shaped waveforms. Euorms denotes an effective value of the voltage e_uo. Eworms denotes an effective value of the voltage e_wo. fsd denotes a stand-alone operating frequency fsd (e.g., 60 Hz). θsd denotes a phase angle. The phase angle θsd is a function of time t, and varies depending on the stand-alone operating frequency fsd (e.g., 60 Hz).

In Expressions EQ6, the first and second expressions calculate the effective values Euorms and Eworms, respectively. The third expression indicates that a cycle Tsd of each of the voltages e_uo and e_wo is an inverse number of the stand-alone operating frequency fsd. In this example, the effective values Euorms and Eworms may be calculated using, as a unit, a half of the cycle Tsd of the voltages e_uo and e_wo, respectively.

Description is given next of a specific but non-limiting example of the control section 30.

Figure 2:
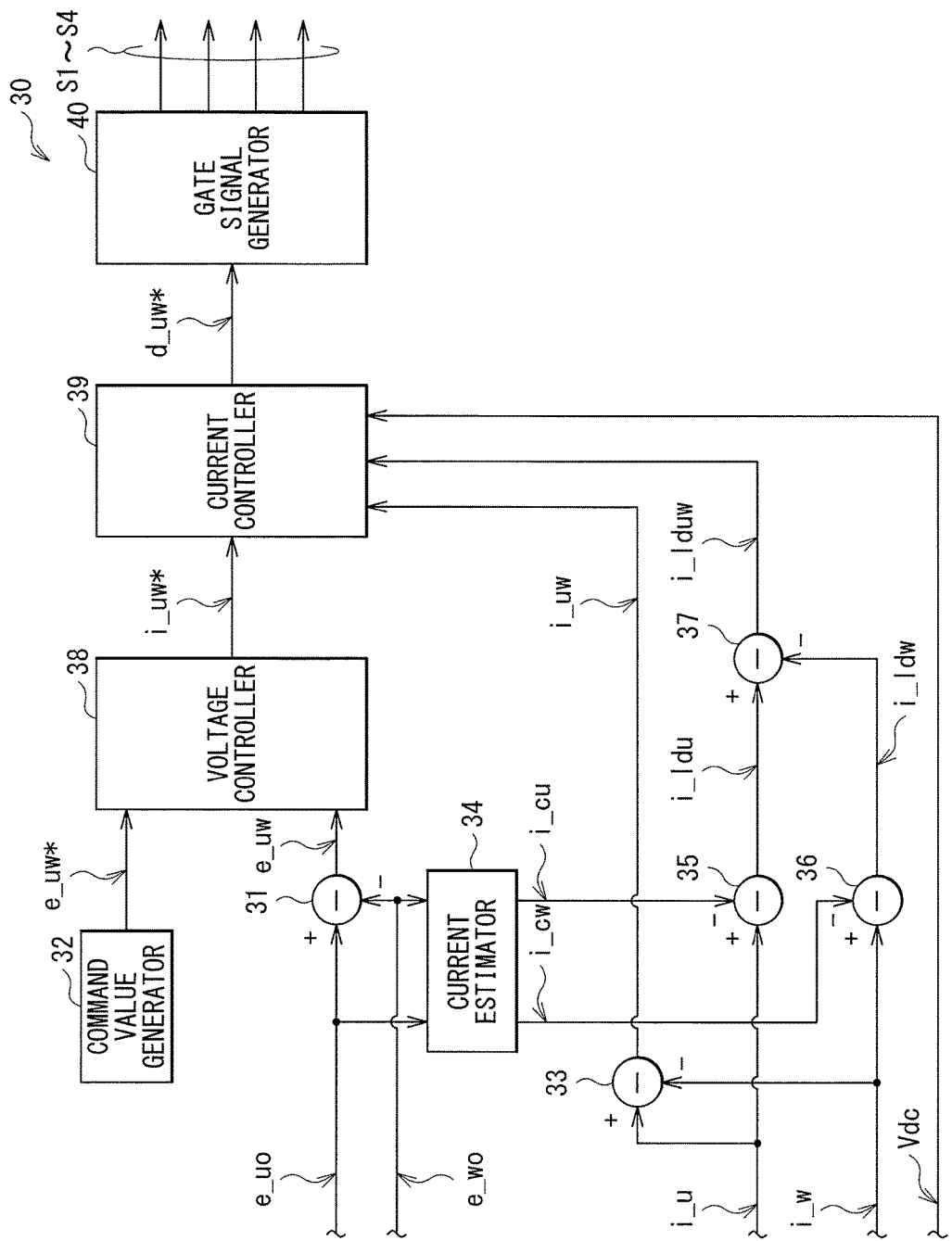
FIG. 2 is a block diagram illustrating a configuration example of a control section illustrated in FIG. 1.

FIG. 2 illustrates a configuration example of a circuit of a constant-voltage-amplitude control in the control section 30. The control section 30 may include a subtractor 31, a command value generator 32, a subtractor 33, a current estimator 34, subtractors 35 to 37, a voltage controller 38, a current controller 39, and a gate signal generator 40. Operational expressions to be used in operational processing of the control section 30 are as follows.

$$\left.\begin{array}{l} e\_uw^* = Emax \cdot \sin(\theta sd) \\ v\_uw^* = Luw\dfrac{d\, i\_uw}{dt} + Ruw \cdot i\_uw + e\_uw^* \\ i\_uw^* = Cuw\dfrac{d\, e\_uw}{dt} + i\_lduw \\ d\_uw^* = \dfrac{v\_uw^*}{Vdc} \\ d\_o^* = \dfrac{v\_u + v\_w}{Vdc} \end{array}\right\} \quad \text{(EQ7)}$$

On the basis of the voltages e_uo and e_wo, the subtractor 31 may subtract the voltage e_wo from the voltage e_uo to thereby determine the AC output voltage e_uw, as indicated by the first expression of Expressions EQ1.

The command value generator 32 may generate a command value e_uw* of the AC output voltage e_uw, as indicated by the first expression of Expressions EQ7. In this expression, Emax denotes an amplitude value, and Osd denotes a phase angle.

On the basis of the currents i_u and i_w, the subtractor 33 may subtract the current i_w from the current i_u to thereby determine the AC output current i_uw, as indicated by the second expression of Expressions EQ1.

On the basis of the voltages e_uo and e_wo, the current estimator 34 may estimate a current, i.e., the estimated current i_cu flowing to the capacitor 25U and estimate a current, i.e., the estimated current i_cw flowing to the capacitor 25W, as indicated, respectively, by the third and fourth expressions of Expressions EQ5. The effective values Euorms and Eworms in the third and fourth expressions of Expressions EQ5 may be determined on the basis of the voltages e_uo and e_wo, respectively, using Expressions EQ6, for example. In this example, the effective values Euorms and Eworms may be calculated using, as a unit, a half of the cycle Tsd of the voltages e_uo and e_wo, respectively. This enables the power conversion device 1 to enhance responsiveness.

On the basis of the current i_u and the estimated current i_cu, the subtractor 35 may subtract the estimated current i_cu from the current i_u to thereby determine the estimated load current i_ldu, as indicated by the first expression of Expressions EQ5.

On the basis of the current i_w and the estimated current i_cw, the subtractor 36 may subtract the estimated current i_cw from the current i_w to thereby determine the estimated load current i_ldw, as indicated by the second expression of Expressions EQ5.

On the basis of the estimated load currents i_ldu and i_ldw, the subtractor 37 may subtract the estimated load current i_ldw from the estimated load current i_ldu to thereby determine the estimated load current difference i_lduw, as indicated by the third expression of Expressions EQ1.

The voltage controller 38 may generate a command value i_uw* of the AC output current i_uw on the basis of the AC output voltage e_uw and the command value e_uw* of the AC output voltage e_uw.

The current controller 39 may determine a duty ratio command value d_uw* on the basis of the AC output current i_uw, the command value i_uw* of the AC output current i_uw, an estimated load current difference i_ld_dm, and the DC bus voltage Vdc.

The voltage controller 38 and the current controller 39 may determine the duty ratio command value d_uw* using the second to fourth expressions of Expressions EQ7.

The gate signal generator 40 may generate the gate signals S1 to S4 on the basis of the duty ratio command value d_uw* using pulse width modulation (PWM).

In the control section 30, the operations may be performed, for example, for each cycle Ts, e.g., 50 µsec. (=1/20 kHz) on the basis of the voltages e_uo and e_wo, the currents i_inv1 and i_inv2, and the DC bus voltage Vdc to thereby determine the duty ratio command value d_uw*, and the gate signal generator 40 may generate the gate signals S1 to S4 based on the duty ratio command value d_uw*. In the power conversion device 1, a loop control of each of the AC output voltage and the AC output current may be performed in this manner to allow a negative feedback to be applied. The loop control allows, in the power conversion device 1, the AC output voltage e_uw to be substantially equal to the command value e_uw* of the AC output voltage e_uw and the AC output current i_uw to be substantially equal to the command value i_uw* of the AC output current i_uw.

Figure 3:
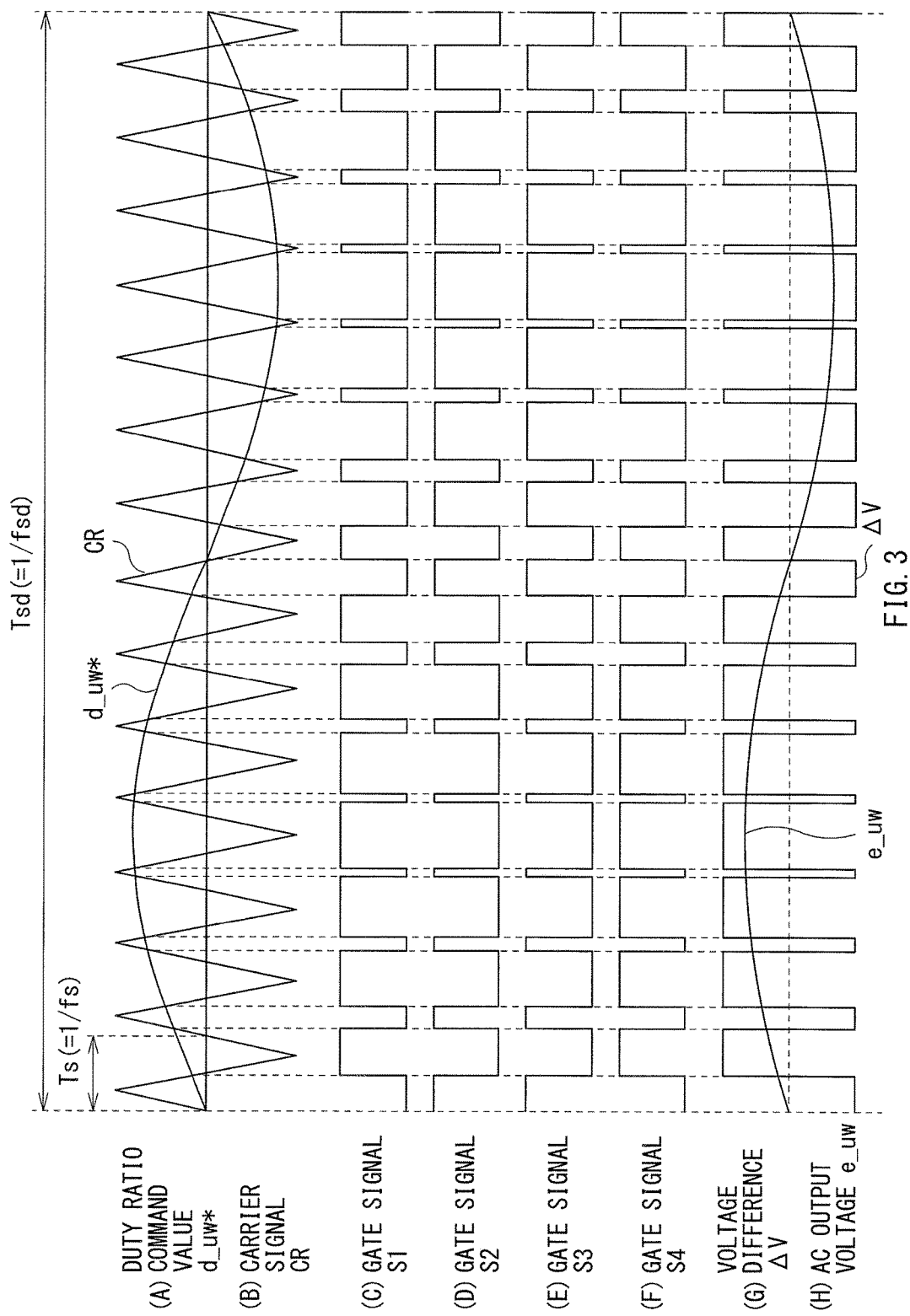
FIG. 3 is a timing waveform diagram illustrating an example of a bipolar PWM operation in the power conversion device illustrated in FIG. 1.

FIG. 3 illustrates an example of respective waveforms of the gate signals S1 to S4 in a case where the power conversion device 1 performs a bipolar PWM operation. (A) of FIG. 3 illustrates the duty ratio command value d_uw*. (B) of FIG. 3 illustrates a waveform of a carrier signal CR. (C) to (F) of FIG. 3 illustrate the respective waveforms of the gate signals S1 to S4. (G) of FIG. 3 illustrates a waveform of a voltage difference ΔV between a voltage at the node N1 and a voltage at the node N2. (H) of FIG. 3 illustrates a waveform of the AC output voltage e_uw. In this example, in a case where the gate signal S1 is in a high level, the switching element SW1 may be brought into an ON state, whereas in a case where the gate signal S1 is in a low level, the switching element SW1 may be brought into an OFF state. The same holds true also for the gate signals S2 to S4. In this FIG. 3, a period of the cycle Ts is made longer for convenience of description; however, for example, the cycle Ts may be set to 50 µsec. (=1/20 kHz), and a cycle Tsd may be set to 16.7 msec. (=1/60 Hz).

The gate signal generator 40 may generate the carrier signal CR as illustrated in (B) of FIG. 3, and may generate the gate signals S1 to S4 as illustrated in (C) to (F) of FIG. 3 on the basis of the carrier signal CR and the duty ratio command value d_uw*, as illustrated in (A) of FIG. 3, supplied from the current controller 39. A pulse width of each of the gate signals S1 to S4 may vary depending on the duty ratio command value d_uw*. In the bipolar PWM operation, switching timings of the four switching elements SW1 to SW4 may be substantially simultaneous. Although not illustrated, a period when the gate signal S1 is in a high level and a period when the gate signal S2 is in a high level may be so set as to be apart from each other by dead time Td. The dead time Td is provided to prevent the high-voltage line HL and the low-voltage line LL from electrically short-circuiting each other. The same holds true also for the gate signals S3 and S4. The voltage difference ΔV between the voltage at the node N1 and the voltage at the node N2 may be a pulse signal corresponding to each of the gate signals S1 to S4, as illustrated in (G) of FIG. 3. The pulse signal may make transition between two voltages. The low-pass filter 29 may remove a high-frequency component included in the pulse signal. In this manner, the power conversion device 1 may generate the AC output voltage e_uw, as illustrated in (H) of FIG. 3.

Figure 4:
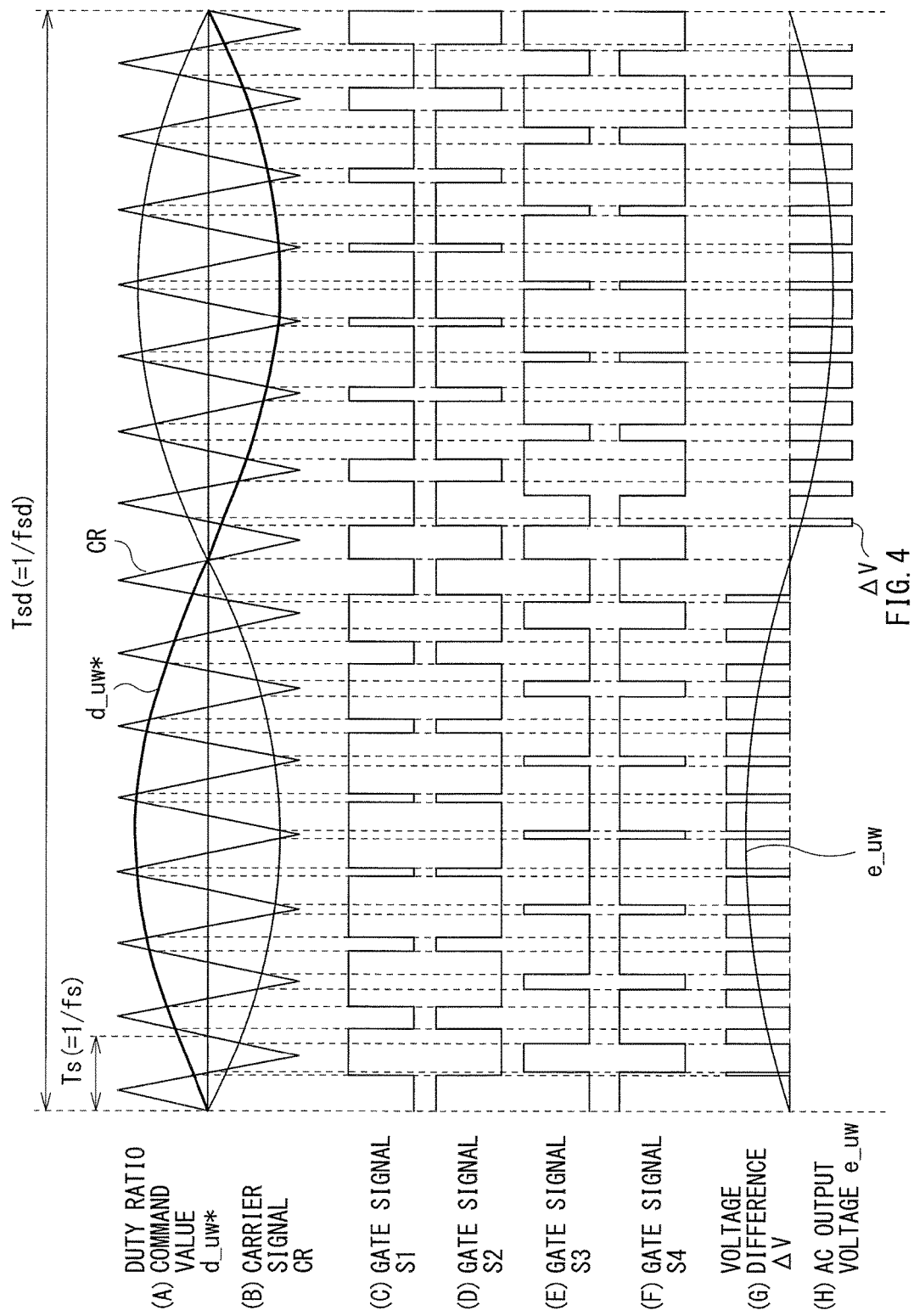
FIG. 4 is a timing waveform diagram illustrating an example of a unipolar PWM operation in the power conversion device illustrated in FIG. 1.

FIG. 4 illustrates an example of respective waveforms of the gate signals S1 to S4 in a case where the power conversion device 1 performs a unipolar PWM operation. (A) of FIG. 4 illustrates the duty ratio command value d_uw*. (B) of FIG. 4 illustrates a waveform of the carrier signal CR. (C) to (F) of FIG. 4 illustrate the respective waveforms of the gate signals S1 to S4. (G) of FIG. 4 illustrates a waveform of the voltage difference ΔV between the voltage at the node N1 and the voltage at the node N2. (H) of FIG. 4 illustrates a waveform of the AC output voltage e_uw.

The gate signal generator 40 may generate the carrier signal CR as illustrated in (B) of FIG. 4, and may generate the gate signals S1 to S4 as illustrated in (C) to (F) of FIG. 4 on the basis of the carrier signal CR and the duty ratio command value d_uw*, as illustrated in (A) of FIG. 4, supplied from the current controller 39. Unlike the case of the bipolar PWM operation illustrated in FIG. 3, in the unipolar PWM operation, switching timings of the switching elements SW1 and SW2 and switching timings of the switching elements SW3 and SW4 may be different from one another. The voltage difference ΔV between the voltage at the node N1 and the voltage at the node N2 may be a pulse signal corresponding to each of the gate signals S1 to S4, as illustrated in (G) of FIG. 5. The pulse signal may make transition among three voltages. The pulse signal has a transition frequency that is twice the case of the bipolar PWM operation illustrated in FIG. 3. The low-pass filter 29 may remove a high-frequency component included in the pulse signal. In this manner, the power conversion device 1 may generate the AC output voltage e_uw, as illustrated in (H) of FIG. 4.

[Concerning Voltage Control of Neutral Point]

Figure 5:
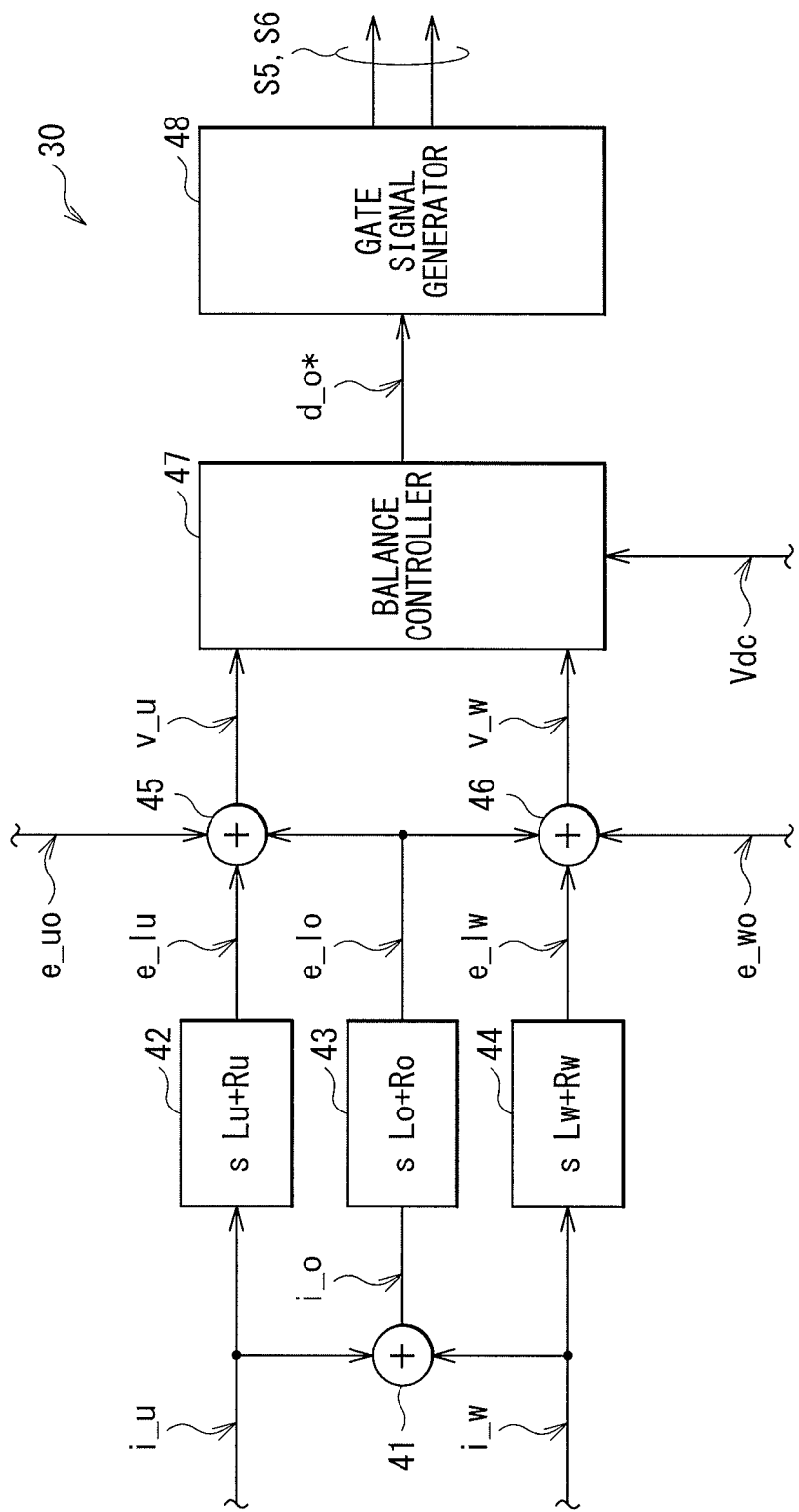
FIG. 5 is another block diagram illustrating a configuration example of the control section illustrated in FIG. 1.

FIG. 5 illustrates a configuration example of a circuit in association with a voltage control of a neutral point in the control section 30. The control section 30 may further include an adder 41, operators 42 to 44, adders 45 and 46, a balance controller 47, and a gate signal generator 48.

On the basis of the currents i_u and i_w, the adder 41 may add the currents i_u and i_w together to thereby determine the current i_o, as indicated by Expression EQ2.

The operator 42 may use a Laplace-transformed expression of the third expression of Expressions EQ4 on the basis of the current i_u to determine the voltage difference e_lu across the AC reactor 24U. That is, the term "s Lu+Ru" corresponds to the Laplace-transformed expression of the third expression of Expressions EQ4. For example, in a case where the AC reactor 24U is omitted from the power conversion device 1, the inductance Lu may be "0" H and the internal resistance value Ru may be "0" S2, thus causing the voltage difference e_lu to be "0".

The operator 43 may use a Laplace-transformed expression of the fourth expression of Expressions EQ4 on the basis of the current i_o to determine the voltage difference e_lo across the AC reactor 24O. That is, the term "s Lo+Ro" corresponds to the Laplace-transformed expression of the fourth expression of Expressions EQ4. For example, in a case where the AC reactor 24O is omitted from the power conversion device 1, the inductance Lo may be "0" H and the internal resistance value Ro may be "0" S2, thus causing the voltage difference e_lo to be "0".

The operator 44 may use a Laplace-transformed expression of the fifth expression of Expressions EQ4 on the basis of the current i_w to determine the voltage difference e_lw across the AC reactor 24W. That is, the term "s Lw+Rw" corresponds to the Laplace-transformed expression of the fifth expression of Expressions EQ4. For example, in a case where the AC reactor 24W is omitted from the power conversion device 1, the inductance Lw may be "0" H and the internal resistance value Rw may be "0" S2, thus causing the voltage difference e_lw to be "0".

The adder 45 may use the first expression of Expressions EQ4 on the basis of the voltage e_uo and the voltage differences e_lu and e_lo to thereby determine the estimated voltage v_u.

The adder 46 may use the second expression of Expressions EQ4 on the basis of the voltage e_wo and the voltage differences e_lw and e_lo to thereby determine the estimated voltage v_w.

The balance controller 47 may use the fifth expression of Expressions EQ7 on the basis of the estimated voltages v_uo and v_wo and the DC bus voltage Vdc to thereby determine the duty ratio command value d_o*.

The gate signal generator 48 may use the pulse width modulation on the basis of the duty ratio command value d_o* to generate the gate signals S5 and S6.

In the control section 30, the operations may be performed, for example, for each cycle Ts, e.g., 50 μsec. (=1/20 kHz) on the basis of the voltages e_uo and e_wo, the currents i_inv1 and i_inv2, and the DC bus voltage Vdc, to thereby determine the duty ratio command value d_o*, and the gate signal generator 48 may generate the gate signals S5 and S6 based on the duty ratio command value d_o*. In the power conversion device 1, a loop control of the neutral point voltage may be performed in this manner to allow a negative feedback to be applied. The loop control allows, in the power conversion device 1, the neutral point voltage to be controlled to maintain a balance of the voltage at the neutral point.

Figure 6A:
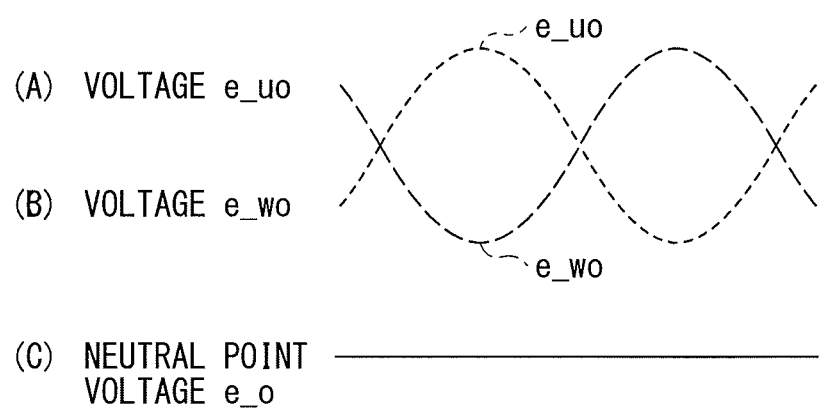
FIG. 6A is a waveform diagram illustrating an example of an operation of controlling a neutral point.
Figure 6B:
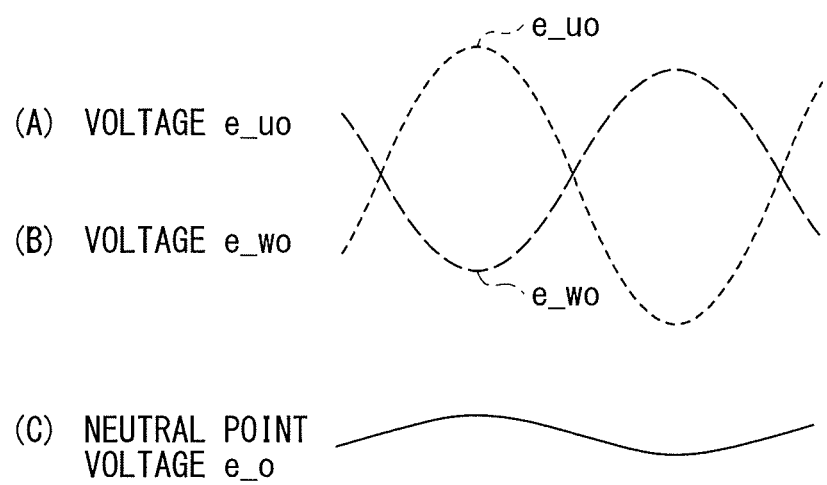
FIG. 6B is a waveform diagram illustrating another example of an operation of controlling the neutral point.

FIGS. 6A and 6B each illustrate an example of a voltage control of the neutral point. FIG. 6A illustrates a case where the U-phase load and the W-phase load are balanced (i.e., a balanced load state). FIG. 6B illustrates a case where the U-phase load and the W-phase load are unbalanced (i.e., an unbalanced load state). (A) of FIGS. 6A and 6B each illustrate a waveform of the voltage e_uo. (B) of FIGS. 6A and 6B each illustrate a waveform of the voltage e_wo. (C) of FIGS. 6A and 6B each illustrate a waveform of a neutral point voltage e_o in the neutral line OL. In a case where the U-phase load and the W-phase load are balanced, the neutral point voltage e_o may come close to a DC voltage as illustrated in FIG. 6A. In a case where the U-phase load and the W-phase load are unbalanced, the neutral point voltage e_o may be an AC voltage to maintain a balance of the voltage at the neutral point as illustrated in FIG. 6B. In this manner, the control section 30 may control the neutral point voltage.

As illustrated in FIG. 5, on the basis of the currents i_u and i_w, the operators 42 to 44, in the control section 30, may determine, respectively, the voltage difference e_lu across the AC reactor 24U, the voltage difference e_lw across the AC reactor 24W, and the voltage difference e_lo across the AC reactor 24O. The adder 45 may determine the estimated voltage v_u on the basis of the voltage difference e_lu across the AC reactor 24U, the voltage e_uo, and the voltage difference e_lo across the AC reactor 24O. The adder 46 may determine the estimated voltage v_w on the basis of the voltage difference e_lw across the AC reactor 24W, the voltage e_wo, and the voltage difference e_lo across the AC reactor 24O. On the basis of the estimated voltages v_u and v_w, the balance controller 47 may determine the duty ratio command value d_o*. On the basis of the duty ratio command value d_o*, the gate signal generator 48 may generate the gate signals S5 and S6. Accordingly, even in a case where the load state suddenly changes from the balanced load state to the unbalanced load state, it is possible for the power conversion device 1 to suppress fluctuation of the AC output voltage, i.e., the voltages e_uo and e_wo and to suppress steady-state deviation. Particularly, in the control section 30, the adder 41, the operators 42 to 44, and the adders 45 and 46 may serve as a feed-forward controller to thereby generate the estimated voltages v_u and v_w. This enables the power conversion device 1 to enhance stability of the control operation.

The switching element SW1 corresponds to a specific but non-limiting example of a "first switching element" in one embodiment of the disclosure. The switching element SW2 corresponds to a specific but non-limiting example of a "second switching element" in one embodiment of the disclosure. The switching element SW3 corresponds to a specific but non-limiting example of a "third switching element" in one embodiment of the disclosure. The switching element SW4 corresponds to a specific but non-limiting example of a "fourth switching element" in one embodiment of the disclosure. The switching element SW5 corresponds to a specific but non-limiting example of a "fifth switching element" in one embodiment of the disclosure. The switching element SW6 corresponds to a specific but non-limiting example of a "sixth switching element" in one embodiment of the disclosure. The high-voltage line HL corresponds to a specific but non-limiting example of a "first voltage line" in one embodiment of the disclosure. The low-voltage line LL corresponds to a specific but non-limiting example of a "second voltage line" in one embodiment of the disclosure. The node N1 corresponds to a specific but non-limiting example of a "first node" in one embodiment of the disclosure. The node N2 corresponds to a specific but non-limiting example of a "second node" in one embodiment of the disclosure. The node N3 corresponds to a specific but non-limiting example of a "third node" in one embodiment of the disclosure. The terminal T21 corresponds to a specific but non-limiting example of a "first output terminal" in one embodiment of the disclosure. The terminal T22 corresponds to a specific but non-limiting example of a "second output terminal" in one embodiment of the disclosure. The terminal T23 corresponds to a specific but non-limiting example of a "third output terminal" in one embodiment of the disclosure. The low-pass filter 29 corresponds to a specific but non-limiting example of a "low-pass filter" in one embodiment of the disclosure. The AC reactor 24U corresponds to a specific but non-limiting example of a "first reactor" in one embodiment of the disclosure. The AC reactor 24W corresponds to a specific but non-limiting example of a "second reactor" in one embodiment of the disclosure. The AC reactor 24O corresponds to a specific but non-limiting example of a "third reactor" in one embodiment of the disclosure. The capacitor 25U corresponds to a specific but non-limiting example of a "first capacitor" in one embodiment of the disclosure. The capacitor 25W corresponds to a specific but non-limiting example of a "second capacitor" in one embodiment of the disclosure. The control section 30 corresponds to a specific but non-limiting example of a "control section" in one embodiment of the disclosure.

The voltage e_uo corresponds to a specific but non-limiting example of a "first voltage" in one embodiment of the disclosure. The voltage e_wo corresponds to a specific but non-limiting example of a "second voltage" in one embodiment of the disclosure. The voltage difference e_lu corresponds to a specific but non-limiting example of a "first voltage difference" in one embodiment of the disclosure. The voltage difference e_lw corresponds to a specific but non-limiting example of a "second voltage difference" in one embodiment of the disclosure. The voltage difference e_lo corresponds to a specific but non-limiting example of a "third voltage difference" in one embodiment of the disclosure. The estimated voltage v_u corresponds to a specific but non-limiting example of a "first value" in one embodiment of the disclosure. The estimated voltage v_w corresponds to a specific but non-limiting example of a "second value" in one embodiment of the disclosure. The estimated load current i_ldu corresponds to a specific but non-limiting example of a "first load current" in one embodiment of the disclosure. The estimated load current i_ldw corresponds to a specific but non-limiting example of a "second load current" in one embodiment of the disclosure.

[Operations and Workings]

Description is given next of operations and workings of the power conversion device 1 of the present example embodiment.

[Outline of Overall Operations]

Description is given first of an outline of overall operations of the power conversion device 1 with reference to FIGS. 1 and 2. The power conversion device 1 may perform the constant-voltage-amplitude control to allow the voltage amplitude of the AC output voltage e_uw to be a predetermined amplitude. In a specific but non-limiting example, the control section 30 may generate the gate signals S1 to S6 on the basis of the following information. Non-limiting examples of the information may include the information about the DC bus voltage Vdc supplied from the voltage detection section 21, the information about the currents i_u and i_w supplied, respectively, from the current detection sections 23U and 23W, and the information about the voltages e_uo and e_wo supplied, respectively, from the voltage detection sections 26U and 26W. This causes the switching elements SW1 to SW6 to be turned ON and OFF on the basis of the gate signals S1 to S6, respectively. The control section 30 may turn ON and OFF the switching elements SW1 to SW4, for example, to thereby perform the constant-voltage-amplitude control to allow the voltage amplitude of the AC output voltage to be a predetermined amplitude. Further, the control section 30 may turn the switching elements SW5 and SW6 ON and OFF to thereby control the neutral point voltage e_o to maintain a balance of the voltage at the neutral point, i.e., the neutral line OL.

[Detailed Operation]

As illustrated in FIG. 2, in the control section 30, the duty ratio command value d_uw* may be determined, for example, for each cycle Ts, e.g., 50 μsec. (=1/20 kHz) on the basis of the voltages e_uo and e_wo, the currents i_u and i_w, and the DC bus voltage Vdc, and the gate signal generator 40 may generate the gate signals S1 to S4 based on the duty ratio command value d_uw*. The loop control allows, in the power conversion device 1, the AC output voltage e_uw to be substantially equal to the command value e_uw* of the AC output voltage e_uw and the AC output current i_uw to be substantially equal to the command value i_uw* of the AC output current i_uw.

Further, as illustrated in FIG. 5, in the control section 30, the duty ratio command values d_o* may be determined, for example, for each cycle Ts, e.g., 50 μsec. (=1/20 kHz) on the basis of the voltages e_uo and e_wo, the currents i_u and i_w, and the DC bus voltage Vdc, and the gate signal generator 48 may generate the gate signals S5 and S6 based on the command value d_o*. The loop control allows, in the power conversion device 1, the neutral point voltage e_o to be controlled to maintain a balance of the voltage at the neutral point, i.e., the neutral line OL.

Although the power conversion device 1 illustrated in FIG. 1 is provided with the three AC reactors 24U, 24W, and 24O, this is not limitative; one of the three AC reactors 24U, 24W, and 24O may be omitted. Description is given below in detail of operations and workings, by exemplifying the power conversion device 1 (a power conversion device 1A) omitting the AC reactor 24O.

Figure 7:
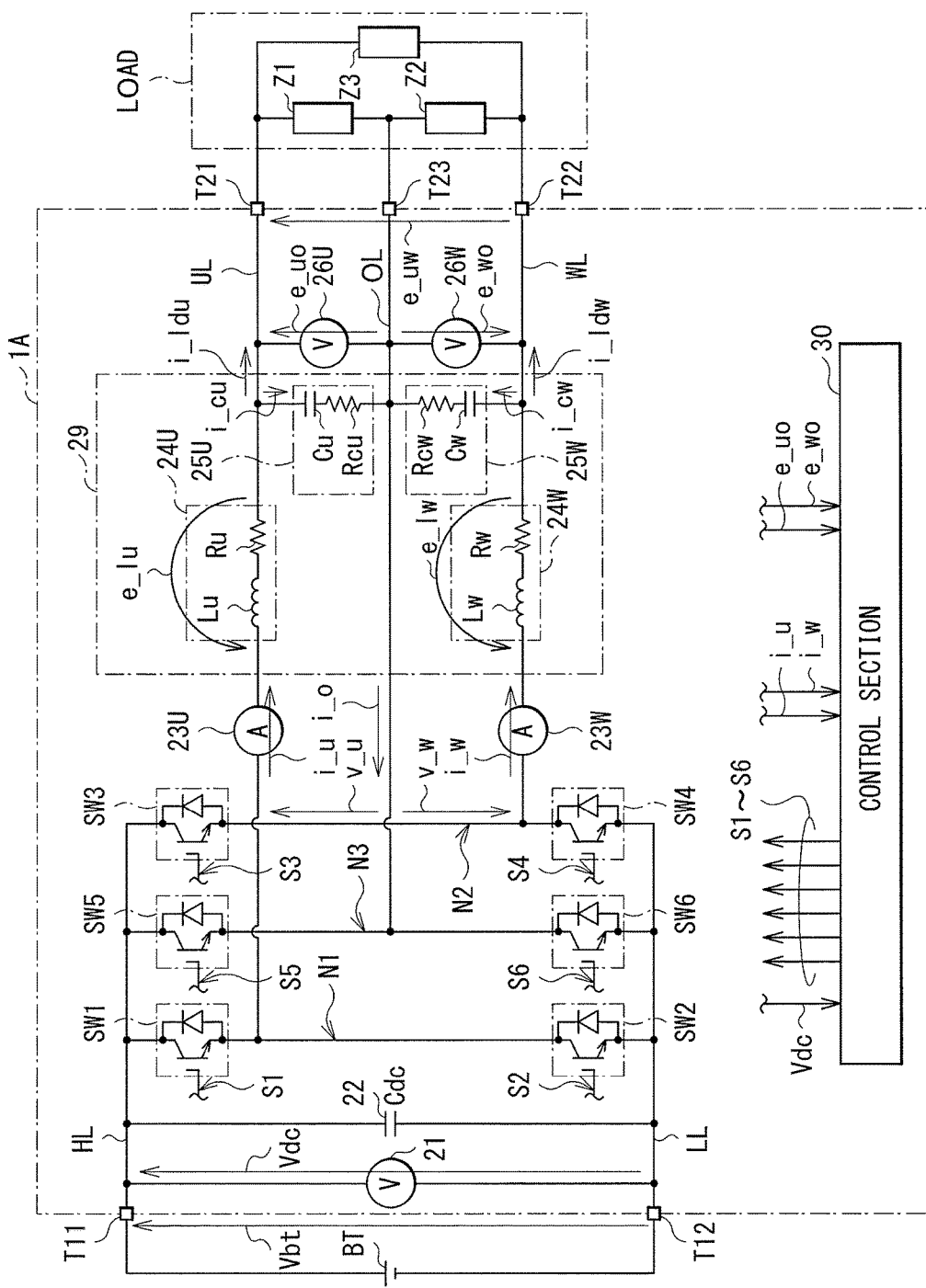
FIG. 7 is a circuit diagram illustrating a configuration example of another power conversion device according to one example embodiment.

FIG. 7 illustrates a configuration example of the power conversion device 1A. The power conversion device 1A may not be provided with the AC reactor 24O, thus making it possible to make the device smaller. FIG. 8 indicates simulation conditions. In the power conversion device 1A that includes no AC reactor 24O, the inductance Lo of the AC reactor 24O may be set to "0" H and the internal resistance value Ro of the AC reactor 24O may be set to "0"Ω.

[Concerning Estimation of Currents Flowing to Capacitors 25U and 25W]

In the power conversion device 1A, the current estimator 34 of the control section 30 may estimate a current, i.e., the estimated current i_cu flowing to the capacitor 25U and a current, i.e., the estimated current i_cw flowing to the capacitor 25W on the basis of the voltages e_uo and e_wo, respectively, as indicated by Expression EQ2. The subtractor 35 may determine the estimated load current i_ldu on the basis of the current i_u and the estimated current i_cu as indicated by the first expression of Expressions EQ5. The subtractor 36 may determine the estimated load current i_ldw on the basis of the current i_w and the estimated current i_cw as indicated by the second expression of Expressions EQ5. As illustrated in FIG. 2, the control section 30 may control the operations of the switching elements SW1 to SW4 on the basis of the estimated load currents i_ldu and i_ldw. In this manner, addition of the estimated currents i_cu and i_cw as disturbance components to the current control loop enables the power conversion device 1A to enhance responsiveness of the current control.

The estimation of the currents flowing to the capacitors 25U and 25W allows the power conversion device 1A to determine the estimated load currents i_ldu and i_ldw. This enables the power conversion device 1A to omit a current detection section that detects a load current and thus to make the device smaller.

In the power conversion device 1A, the estimated currents i_cu and i_cw may be determined using the third and fourth expressions of Expressions EQ5, thus making it possible to suppress noise. Description is given below using simulation results.

Figure 9:
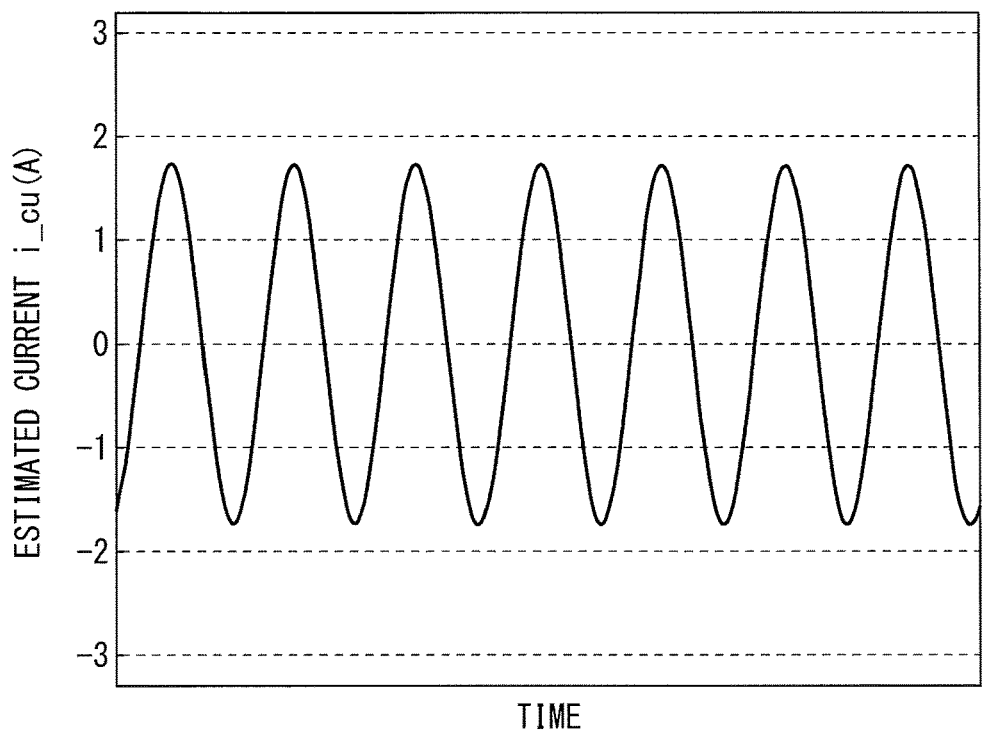
FIG. 9 is a waveform diagram illustrating a waveform example of an estimated current of the power conversion device illustrated in FIG. 1.

FIG. 9 illustrates an example of simulation results of a waveform of the estimated current i_cu. As indicated by the third expression of Expressions EQ5, the current estimator 34 may determine the estimated current i_cu using a sine function that is a periodic function. An amplitude of the sine function may include the effective value Euorms of the voltage e_uo. The effective value Euorms may be determined by the voltage e_uo as indicated by the first expression of Expressions EQ6. The same holds true also for the estimate current i_c2. The determination of the estimated currents i_cu and i_cw using such a periodic function enables the power conversion device 1As to reduce a possibility that noise may occur in the estimated currents i_c1 and i_c2, as compared with a reference example R described below.

A power conversion device 1R according to the reference example R differs from the case of the present example embodiment in the way each of the estimated currents 1_cu and 1_cw is determined. The reference example R corresponds to Japanese Unexamined Patent Application Publication No. 2015-231259 in terms of technique. The power conversion device 1R determines the estimated currents i_cu and i_cw using the following Expressions EQ8.

$$\left. \begin{array}{l} i\_cu = \dfrac{s \cdot Rcu}{S \cdot Rcu \cdot Cu + 1} \cdot e\_uo \\ i\_cw = \dfrac{s \cdot Rcw}{S \cdot Rcw \cdot Cw + 1} \cdot e\_wo \end{array} \right\} \quad (EQ8)$$

Expressions EQ8 are each represented by a Laplace transformation scheme. The first expression includes an operation that differentiates the voltage e_uo. The second expression includes an operation that differentiates the voltage e_wo. Accordingly, in a case where the voltages e_uo and e_wo include distortion or noise, the estimated currents i_cu and i_cw result in occurrence of noises caused by the differentiation of the voltages e_uo and e_wo, respectively.

Figure 10:
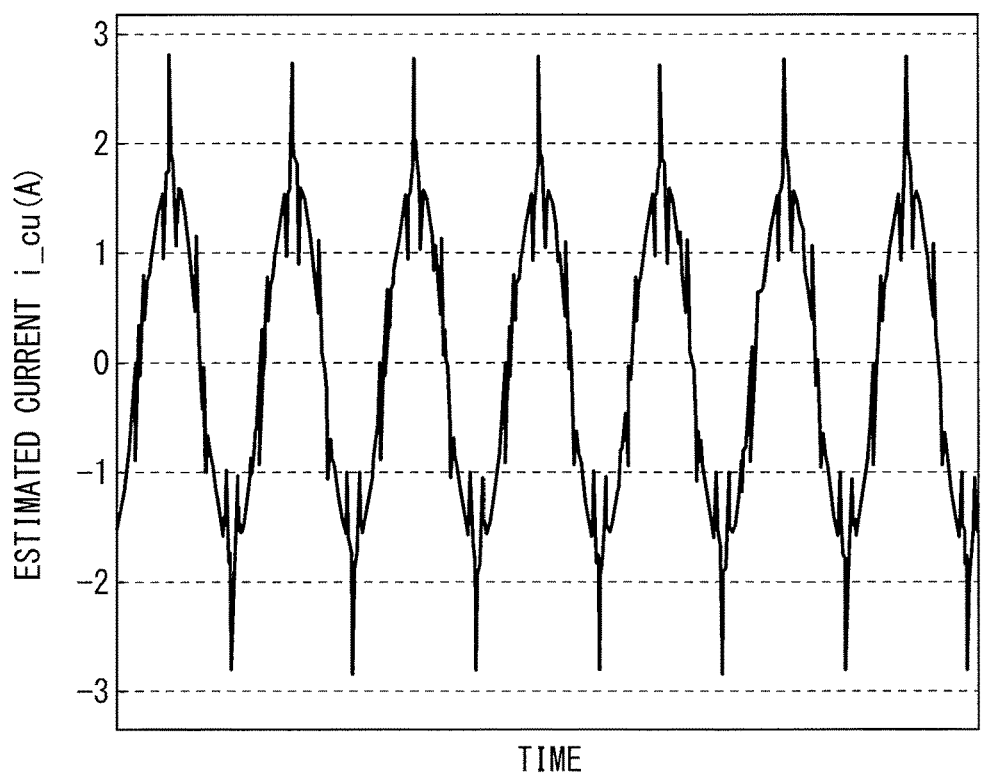
FIG. 10 is a waveform diagram illustrating a waveform example of an estimated current of a reference example.

FIG. 10 illustrates an example of simulation results of the estimated current i_cu in the power conversion device 1R according to the reference example R. As illustrated, in the power conversion device 1R according to the reference example, the estimated current i_cu results in occurrence of noise. The same holds true also for the estimated current i_cw.

Meanwhile, in the power conversion device 1A according to the present example embodiment, a sine function that is a predetermined periodic function may be used to estimate currents flowing to the capacitors 25U and 25W, thus eliminating a differential operation. This reduces a possibility that noise may occur in the estimated currents i_cu and i_cw, as illustrated in FIG. 9. As a result, it becomes possible, in the power conversion device 1A, to reduce a possibility that noise may occur in the AC output voltage e_uw and the AC output current i_uw, for example.

[Concerning Operation in a Case where Load State Suddenly Changes]

As illustrated in FIG. 5, the operators 42 to 44 may determine the voltage difference e_lu across the AC reactor 24U and the voltage difference e_lw across the AC reactor 24W, respectively, on the basis of the currents i_u and i_w, in the power conversion device 1A. The adder 45 may determine the estimated voltage v_u on the basis of the voltage difference e_lu across the AC reactor 24U and the voltage e_uo. The adder 46 may determine the estimated voltage v_w on the basis of the voltage difference e_lw across the AC reactor 24W and the voltage e_wo. On the basis of the estimated voltages v_u and v_w, the balance controller 47 may determine the duty ratio command value d_o*. On the basis of the duty ratio command value d_o*, the gate signal generator 48 may generate the gate signals S5 and S6. Accordingly, even in a case where the load state suddenly changes from the balanced load state to the unbalanced load state, it is possible for the power conversion device 1A to suppress fluctuation of the AC output voltage, i.e., the voltages e_uo and e_wo and to suppress the steady-state deviation. This operation is described below in detail.

Figure 11:
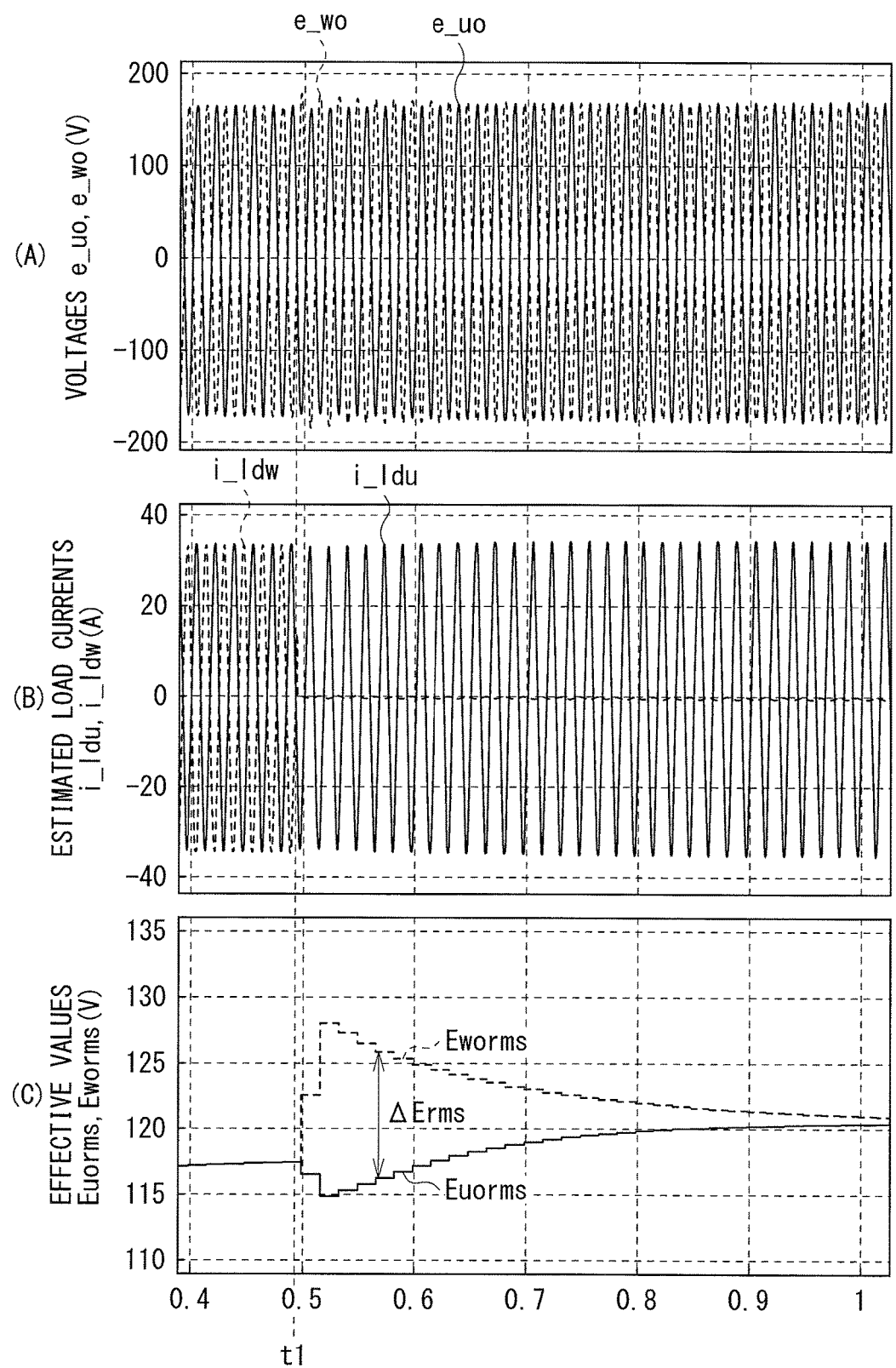
FIG. 11 is a timing waveform diagram illustrating an operation example of the power conversion device illustrated in FIG. 7.

FIG. 11 illustrates simulation results of the power conversion device 1A in a case where the load state suddenly changes. (A) of FIG. 11 illustrates respective waveforms of the voltages e_uo and e_wo. (B) of FIG. 11 illustrates respective waveforms of the estimated load currents i_ldu and i_ldw. (C) of FIG. 11 illustrates respective waveforms of the effective value Euorms of the voltage e_uo and the effective value Eworms of the voltage e_wo.

In this example, at timing t1, the W-phase load (e.g., the impedance Z2 in FIG. 1), of the U-phase load (e.g., the impedance Z1 in FIG. 1) and the W-phase load, is brought into an open state, thereby changing the load state from the balanced load state to the unbalanced load state. This brings the estimated load current i_ldw to substantially "0" (zero) at timing t1 and thereafter, as illustrated in (B) of FIG. 11. In association with this change, an amplitude of the voltage e_wo of the W-phase AC voltage may increase, whereas an amplitude of the voltage e_uo of the U-phase AC voltage may decrease, as illustrated in (A) of FIG. 11. Accordingly, a difference ΔErms between the effective value Euorms of the voltage e_uo and the effective value Eworms of the voltage e_wo may become larger, as illustrated in (C) of FIG. 11. Thereafter, the difference ΔErms between the effective values Euorms and Eworms may become gradually smaller because of loop response, as illustrated in (C) of FIG. 11.

In this manner, the power conversion device 1A may perform the loop control of the neutral point voltage in consideration of the voltage difference e_lu across the AC reactor 24U and the voltage difference e_lw across the AC reactor 24W. This makes it possible to suppress fluctuation of the AC output voltage, i.e., the voltages e_uo and e_wo and to suppress the steady-state deviation, as compared with a case of a reference example S described below.

A power conversion device 1S according to the reference example S performs the loop control of the neutral point voltage without considering the voltage difference e_lu across the AC reactor 24U and the voltage difference e_lw across the AC reactor 24W. In other words, the balance controller 47 of the power conversion device 1S is configured to determine the duty ratio command value d_o* on the basis of the voltages e_uo and e_wo.

Figure 12:
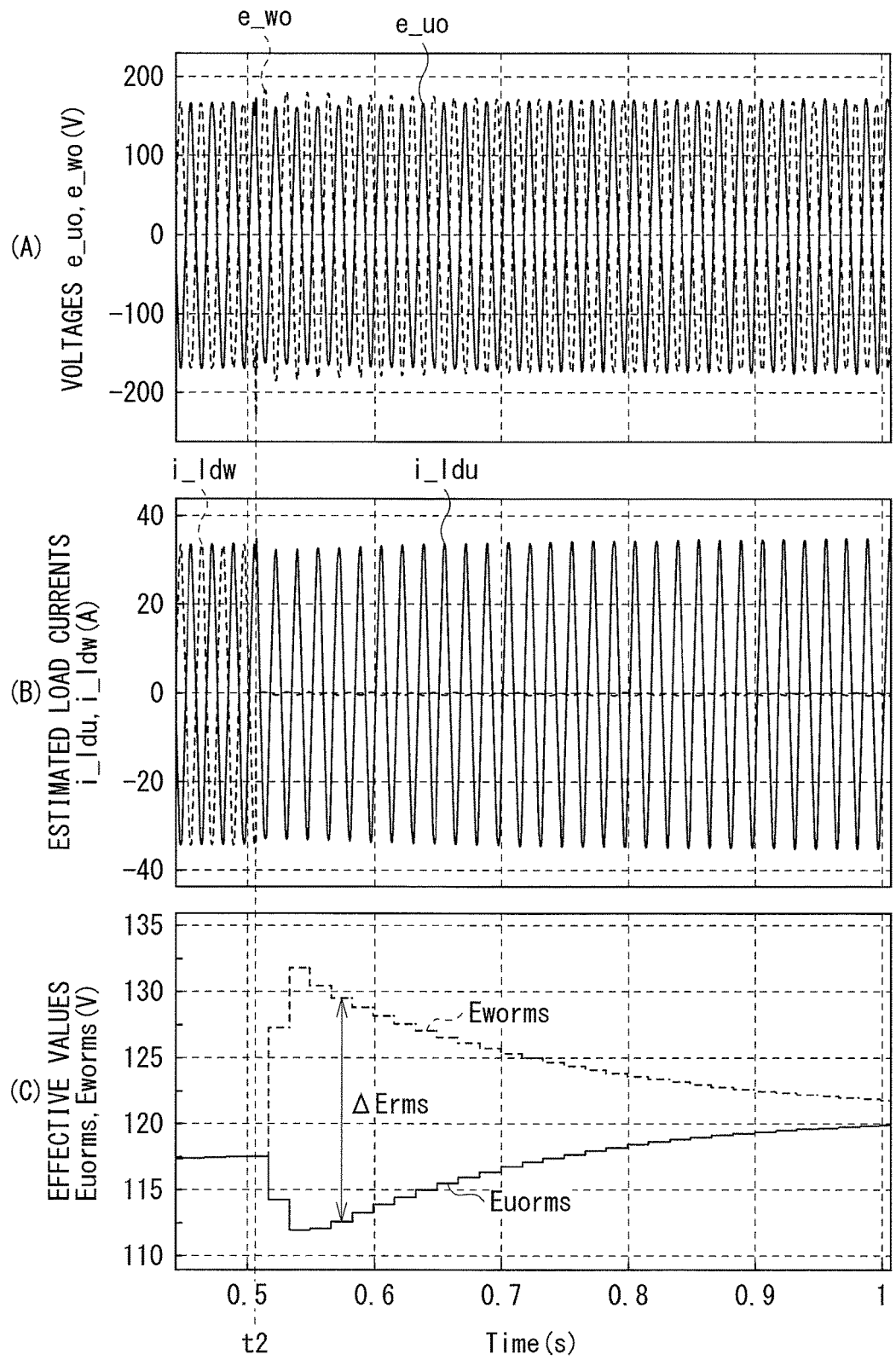
FIG. 12 is a timing waveform diagram illustrating an operation example of a power conversion device according to another reference example.

FIG. 12 illustrates simulation results of the power conversion device 1S in a case where the load state suddenly changes. (A) of FIG. 12 illustrates respective waveforms of the voltages e_uo and e_wo. (B) of FIG. 12 illustrates respective waveforms of the estimated load currents i_ldu and i_ldw. (C) of FIG. 12 illustrates respective waveforms of the effective value Euorms of the voltage e_uo and the effective value Eworms of the voltage e_wo.

In this example, at timing t2, the W-phase load, of the U-phase load and the W-phase load, is brought into an open state. This brings the estimated load current i_ldw to substantially "0" (zero) at timing t2 and thereafter, as illustrated in (B) of FIG. 12. In association with this change, an amplitude of the voltage e_wo of the W-phase AC voltage increases, whereas an amplitude of the voltage e_uo of the U-phase AC voltage decreases, as illustrated in (A) of FIG. 12. Accordingly, as illustrated in (C) of FIG. 12, the difference ΔErms between the effective values Euorms and Eworms in the power conversion device 1S becomes larger than the case of the foregoing example embodiment illustrated in (C) of FIG. 11. In this manner, in a case where the voltage difference e_lu across the AC reactor 24U and the voltage difference e_lw across the AC reactor 24W are not taken into consideration, there is a possibility that a fluctuation of the AC output voltage, i.e., the voltages e_uo and e_wo may become larger and that the steady-state deviation may become larger.

Meanwhile, in the power conversion device 1A according to the present example embodiment, the voltage difference e_lu across the AC reactor 24U and the voltage difference e_lw across the AC reactor 24W may be determined; the duty ratio command value d_o* may be determined on the basis of the voltages e_uo and e_wo and the voltage differences e_lu and e_lw; and the gate signals S5 and S6 may be generated on the basis of the duty ratio command value d_o*. This enables the power conversion device 1A to take into consideration the voltage difference e_lu across the AC reactor 24U and the voltage difference e_lw across the AC reactor 24W, in the loop control of the neutral point voltage, thus making it possible to perform a more effective loop control. As a result, it becomes possible for the power conversion device 1A to suppress fluctuation of the AC output voltage, i.e., the voltages e_uo and e_wo and to suppress the steady-state deviation, even in the case where the load state suddenly changes.

Description has been given above of the operation of the power conversion device 1A, illustrated in FIG. 7, omitting the AC reactor 24O; the same holds true also for the power conversion device 1 including the three AC reactors 24U, 24W, and 24O, illustrated in FIG. 1. That is, in the power conversion device 1, the voltage difference e_lu across the AC reactor 24U, the voltage difference e_lw across the AC reactor 24W, and the voltage difference e_lo across the AC reactor 24O may be determined; the duty ratio command value d_o* may be determined on the basis of the voltages e_uo and e_wo and the voltage differences e_lu, e_lw, and e_lo; and the gate signals S5 and S6 may be generated on the basis of the duty ratio command value d_o*. This makes it possible to suppress fluctuation of the AC output voltage, i.e., the voltages e_uo and e_wo and to suppress the steady-state deviation, even in the case where the load state suddenly changes.

Further, the power conversion device 1 may be provided with the adder 41, the operators 42 to 44, and the adders 45 and 46 to generate the estimated voltages v_u and v_w using a feedforward control. This makes it possible, in the power conversion device 1, to enhance stability of the control operation as compared with a case of performing a feedback control, for example.

[Effects]

As described above, in the present example embodiment, respective voltage differences across the AC reactors may be determined, and the operations of the switching elements SW5 and SW6 may be controlled on the basis of the voltages e_uo and e_wo and the voltage differences. This makes it possible to suppress fluctuation of the AC output voltage and to suppress the steady-state deviation, even in the case where the load state suddenly changes.

In the present example embodiment, the adder 41, the operators 42 to 44, and the adders 45 and 46 may be provided to generate the estimated voltages v_u and v_w using a feedforward control, thus making it possible to enhance stability of the control operation.

In the present example embodiment, a sine function that is a periodic function may be used to estimate a current flowing to the capacitor, thus eliminating a differential operation. This reduces a possibility that noise may occur.

Modification Example 1

Figure 13:
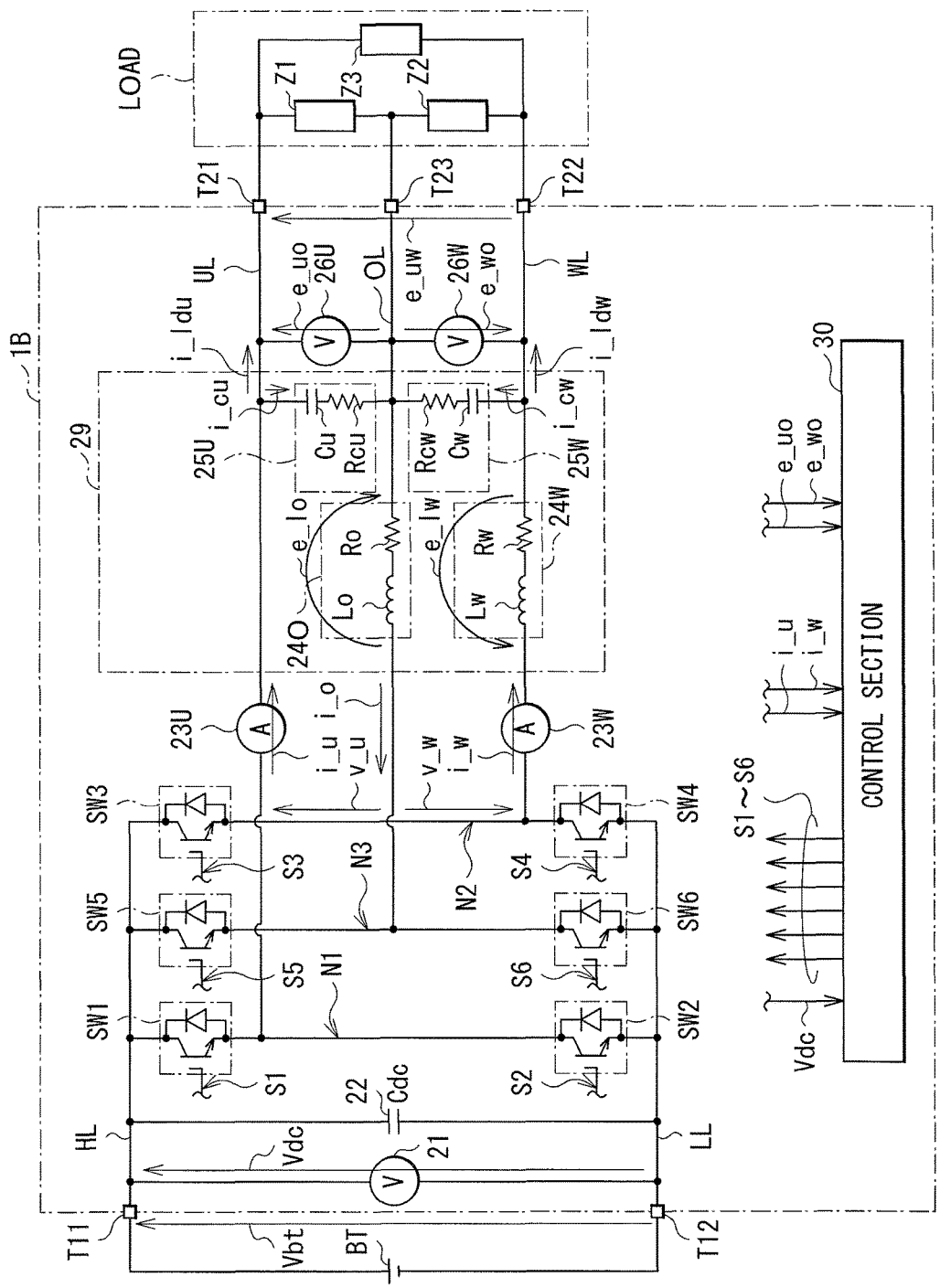
FIG. 13 is a circuit diagram illustrating a configuration example of another power conversion device according to one example embodiment.
Figure 14:
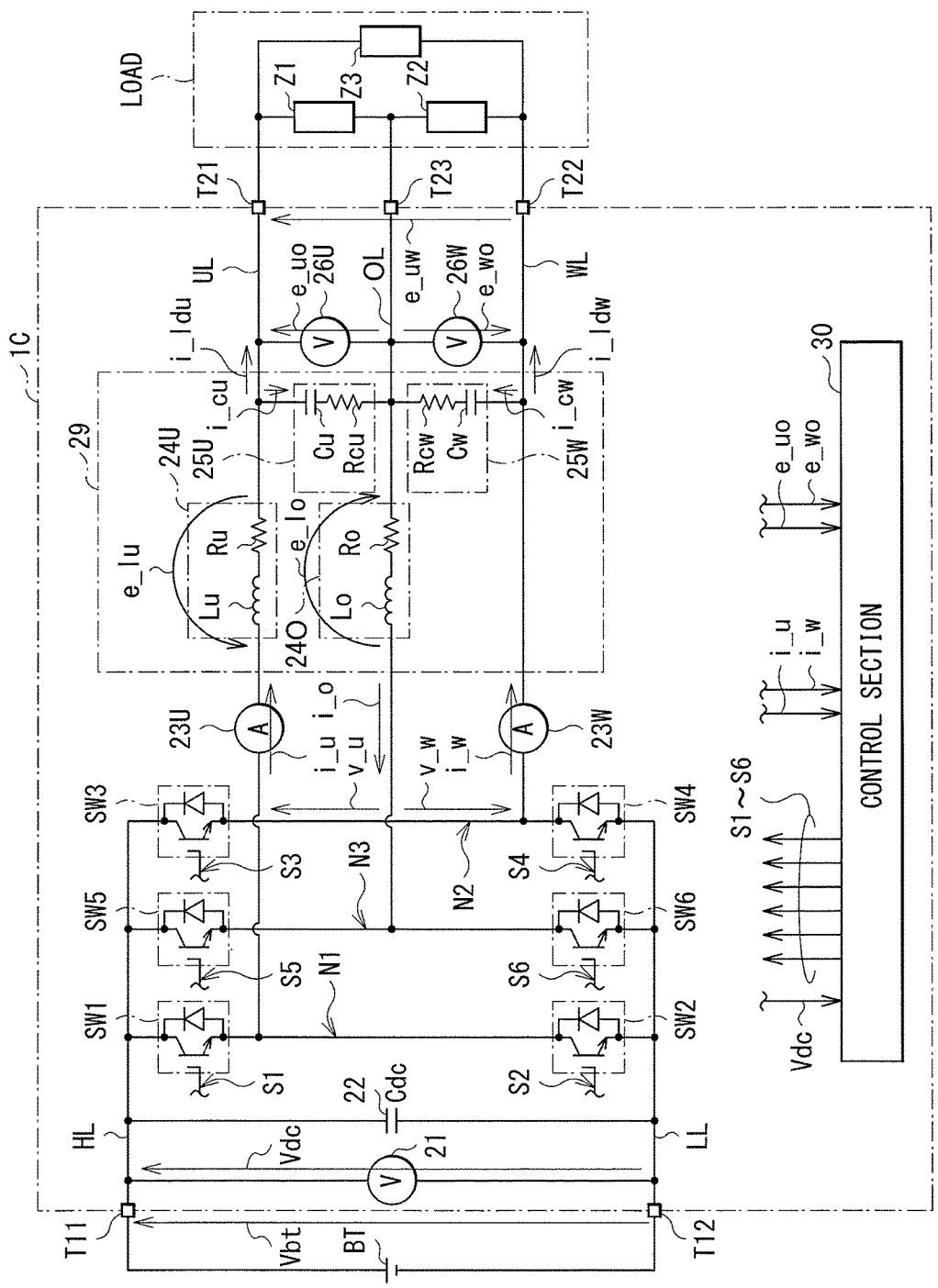
FIG. 14 is a circuit diagram illustrating a configuration example of another power conversion device according to one example embodiment.

As illustrated in FIG. 1, in the foregoing example embodiment, the three AC reactors 24U, 24W, and 24O are provided. In another example embodiment, the two AC reactors 24U and 24W are provided as illustrated in FIG. 7. However, this is not limitative. In an alternative embodiment, for example, the two AC reactors 24W and 24O may be provided as in a power conversion device 1B illustrated in FIG. 13. In the power conversion device 1B, the voltage difference e_lw across the AC reactor 24W and the voltage difference e_lo across the AC reactor 24O may be determined; the duty ratio command value d_o* may be determined on the basis of the voltages e_uo and e_wo and the voltage differences e_lw and e_lo; and the gate signals S5 and S6 may be generated on the basis of the duty ratio command value d_o*. Further, as in a power conversion device 1C illustrated in FIG. 14, the two AC reactors 24U and 24O may be provided. In the power conversion device 1C, the voltage difference e_lu across the AC reactor 24U and the voltage difference e_lo across the AC reactor 24O may be determined; the duty ratio command value d_o* may be determined on the basis of the voltages e_uo and e_wo and the voltage differences e_lu and e_lo; and the gate signals S5 and S6 may be generated on the basis of the duty ratio command value d_o*.

As described, it is possible for the power conversion device to be provided with two or more AC reactors in two or more paths, out of the path coupling the node N1 and the terminal T21, the path coupling the node N2 and the terminal T22, and the path coupling the node N3 and the terminal T23. It is possible for the power conversion device to calculate respective voltage differences across the two or more AC reactors on the basis of the currents i_u and i_w and to control the operations of the switching elements SW5 and SW6 on the basis of the two or more voltage differences and the voltages e_uo and e_wo.

Modification Example 2

As illustrated in FIG. 1, in the foregoing example embodiment, the current detection section 23U that detects the current i_u flowing from the node N1 to the low-pass filter 29 and the current detection section 23W that detects the current i_w flowing from the node N2 to the low-pass filter 29 are provided. However, this is not limitative. In an alternative embodiment, for example, a current detection section 23O that detects the current i_o flowing from the low-pass filter 29 to the node N3 may be provided, as illustrated in power conversion devices 1D and 1E illustrated in FIGS. 15 and 16, respectively.

Figure 15:
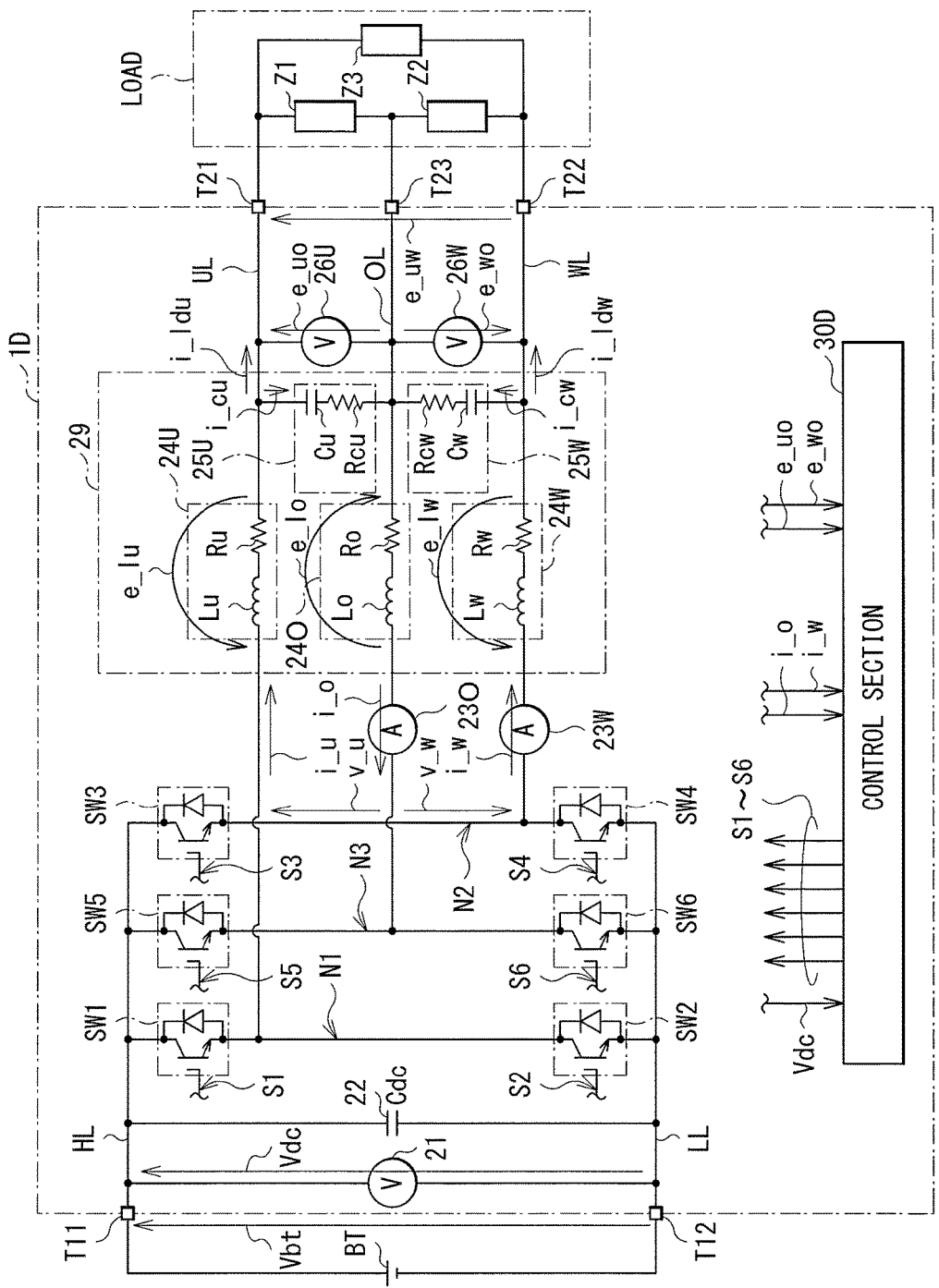
FIG. 15 is a circuit diagram illustrating a configuration example of a power conversion device according to a modification example.

As illustrated in FIG. 15, the power conversion device 1D may include the two current detection sections 23W and 23O and a control section 30D. The current detection section 23O may supply the control section 30D with information about the detected current i_o. The control section 30D may use Expression EQ2, for example, to determine the current i_u on the basis of the information about the current i_w detected by the current detection section 23W and the information about the current i_o detected by the current detection section 23O. This enables the control section 30D to perform operations similarly to the control section 30 according to the foregoing example embodiment, as illustrated in FIGS. 2 and 5, on the basis of the currents i_u and i_w.

Figure 16:
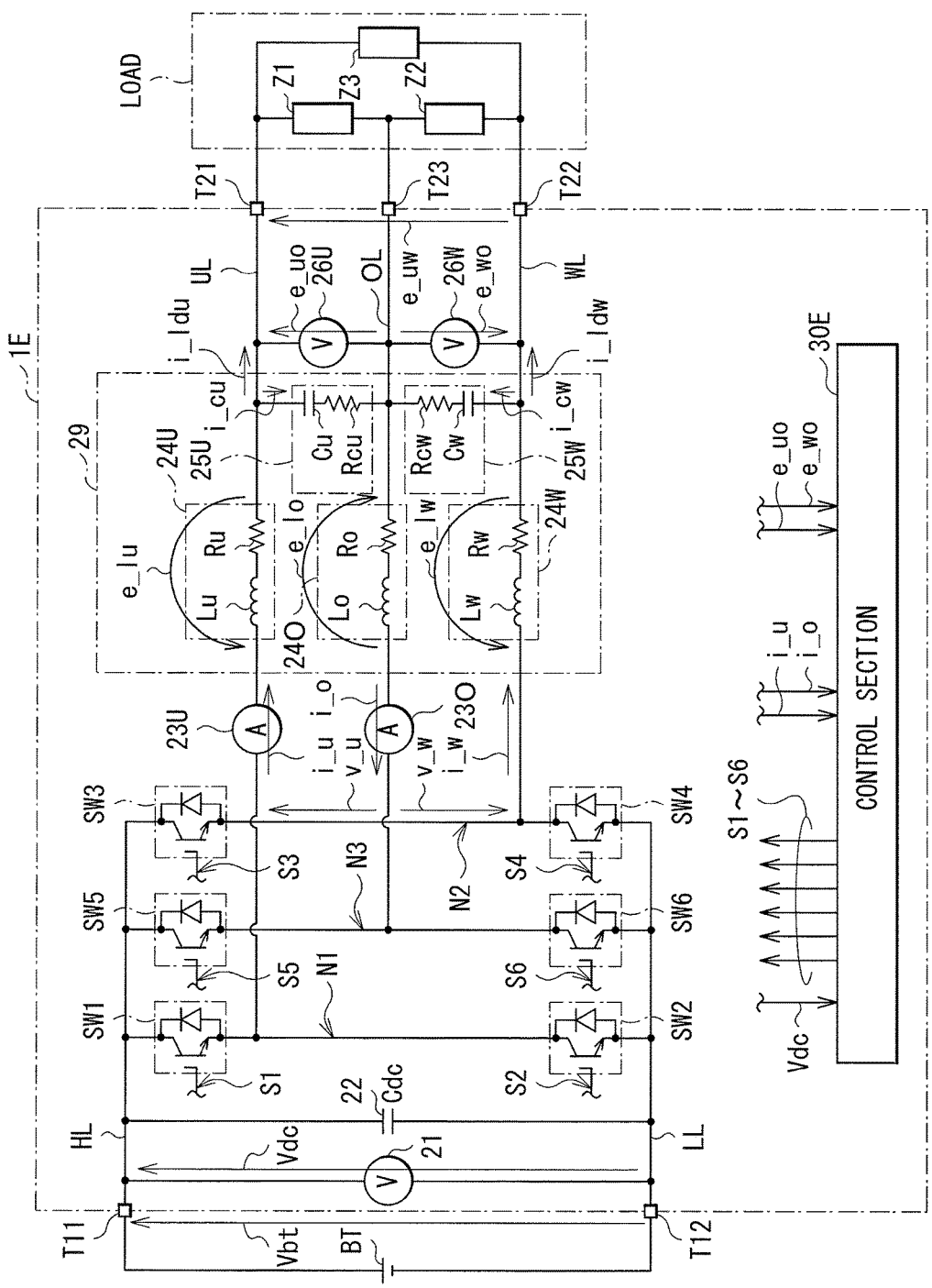
FIG. 16 is a circuit diagram illustrating a configuration example of a power conversion device according to another modification example.

As illustrated in FIG. 16, the power conversion device 1E may include the two current detection sections 23U and 23O and a control section 30E. The current detection section 23O may supply the control section 30E with information about the detected current i_o. The control section 30E may use Expression EQ2, for example, to determine the current i_w on the basis of the information about the current i_u detected by the current detection section 23U and the information about the current i_o detected by the current detection section 23O. This enables the control section 30E to perform operations similarly to the control section 30 according to the foregoing example embodiment, as illustrated in FIGS. 2 and 5, on the basis of the currents i_u and i_w.

The disclosure has been described hereinabove referring to the example embodiment and modification examples. However, the disclosure is not limited to the example embodiment and modification examples, and may be modified in a variety of ways.

For example, although, in the foregoing example embodiment, the technology is applied to the DC/AC inverter that converts DC power fed from the battery BT to AC power, this is not limitative. In an alternative embodiment, the technology may also be applied to a power conversion device having the following two modes. One mode may allow for coupling to a commercial power source to perform grid connected operating, thereby charging and discharging the battery BT. The other mode may allow for coupling to a load device to perform stand-alone operation, thereby supplying the load device with power fed from the battery BT.

Further, for example, set values of respective parameters listed in the simulation conditions indicated in FIG. 8 are exemplary, and may be modified appropriately.

Moreover, the disclosure encompasses any possible combination of some or all of the various embodiments and the modification examples described herein and incorporated herein.

It is possible to achieve at least the following configurations from the above-described example embodiments of the disclosure.

(1)

A power conversion device including:

a first switching element configured to couple a first voltage line to a first node;

a second switching element configured to couple a second voltage line to the first node;

a third switching element configured to couple the first voltage line to a second node;

a fourth switching element configured to couple the second voltage line to the second node;

a fifth switching element configured to couple the first voltage line to a third node;

a sixth switching element configured to couple the second voltage line to the third node;

a first output terminal;

a second output terminal;

a third output terminal;

a low-pass filter including two or more reactors, a first capacitor, and a second capacitor, the two or more reactors being provided in respective two or more paths out of a first path, a second path, and a third path, the first path coupling the first node and the first output terminal, the second path coupling the second node and the second output terminal, the third path coupling the third node and the third output terminal, the first capacitor being provided between the first path and the third path, the second capacitor being provided between the second path and the third path; and a control section configured to calculate two or more voltage differences across the respective two or more reactors on a basis of currents flowing to the respective two or more reactors, and control operations of the fifth switching element and the sixth switching element on a basis of the two or more voltage differences, a first voltage at the first output terminal, and a second voltage at the second output terminal.

(2)

The power conversion device according to (1), in which the two or more reactors include a first reactor provided in the first path, a second reactor provided in the second path, and a third reactor provided in the third path, the control section calculates a first voltage difference across the first reactor, a second voltage difference across the second reactor, and a third voltage difference across the third reactor, and the two or more voltage differences include the first voltage difference, the second voltage difference, and the third voltage difference.

(3)

The power conversion device according to (2), in which the control section calculates a first value on a basis of the first voltage difference, the third voltage difference, and the first voltage, and a second value on a basis of the second voltage difference, the third voltage difference, and the second voltage, and the control section controls the operations of the fifth switching element and the sixth switching element on a basis of the first value and the second value.

(4)

The power conversion device according to (1), in which the two or more reactors include a first reactor provided in the first path and a second reactor provided in the second path, the control section calculates a first voltage difference across the first reactor and a second voltage difference across the second reactor, and the two or more voltage differences include the first voltage difference and the second voltage difference.

(5)

The power conversion device according to (4), in which the control section calculates a first value on a basis of the first voltage difference and the first voltage, and a second value on a basis of the second voltage difference and the second voltage, and the control section controls the operations of the fifth switching element and the sixth switching element on a basis of the first value and the second value.

(6)

The power conversion device according to (1), in which the two or more reactors include a first reactor provided in the first path and a third reactor provided in the third path, the control section calculates a first voltage difference across the first reactor and a third voltage difference across the third reactor, and the two or more voltage differences include the first voltage difference and the third voltage difference.

(7)

The power conversion device according to (6), in which the control section calculates a first value on a basis of the first voltage difference, the third voltage difference, and the first voltage, and a second value on a basis of the third voltage difference and the second voltage, and the control section controls the operations of the fifth switching element and the sixth switching element on a basis of the first value and the second value.

(8)

The power conversion device according to any one of (1) to (7), in which the control section calculates a duty ratio in the fifth switching element and the sixth switching element on a basis of the two or more voltage differences, the first voltage, and the second voltage.

(9)

The power conversion device according to any one of (1) to (8), in which the control section calculates a first load current flowing to the first output terminal on a basis of a current flowing from the first node to the low-pass filter, a second load current flowing to the second output terminal on a basis of a current flowing from the second node to the low-pass filter, and a current difference that is a difference between the first load current and the second load current, and the control section controls operations of the first switching element, the second switching element, the third switching element, and the fourth switching element on a basis of the current difference.

(10)

The power conversion device according to (9), in which the control section calculates the first load current by estimating a current flowing to the first capacitor using a predetermined periodic function, and the second load current by estimating a current flowing to the second capacitor using the predetermined periodic function.

(11)

The power conversion device according to (10), in which the control section estimates an amplitude of the current flowing to the first capacitor on a basis of an effective value of the first voltage, and an amplitude of the current flowing to the second capacitor on a basis of an effective value of the second voltage.

According to the power conversion device of one embodiment of the disclosure, two or more voltage differences across respective two or more reactors are calculated on the basis of currents flowing to the respective two or more reactors, and operations of the fifth switching element and the sixth switching element are controlled on the basis of the two or more voltage differences, a first voltage, and a second voltage. This makes it possible to suppress fluctuation of the AC output voltage.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A power conversion device comprising:
a first switching element configured to couple a first voltage line to a first node;
a second switching element configured to couple a second voltage line to the first node;
a third switching element configured to couple the first voltage line to a second node;
a fourth switching element configured to couple the second voltage line to the second node;
a fifth switching element configured to couple the first voltage line to a third node;
a sixth switching element configured to couple the second voltage line to the third node;
a first output terminal;
a second output terminal;
a third output terminal;
a low-pass filter including two or more reactors, a first capacitor, and a second capacitor, the two or more reactors being provided in respective two or more paths out of a first path, a second path, and a third path, the first path coupling the first node and the first output terminal, the second path coupling the second node and the second output terminal, the third path coupling the third node and the third output terminal, the first capacitor being provided between the first path and the third path, the second capacitor being provided between the second path and the third path; and
a control section configured to
calculate two or more voltage differences across the respective two or more reactors on a basis of currents flowing to the respective two or more reactors, and
control operations of the fifth switching element and the sixth switching element on a basis of the two or more voltage differences, a first voltage at the first output terminal, and a second voltage at the second output terminal.

2. The power conversion device according to claim 1, wherein
the two or more reactors include a first reactor provided in the first path, a second reactor provided in the second path, and a third reactor provided in the third path,
the control section calculates a first voltage difference across the first reactor, a second voltage difference across the second reactor, and a third voltage difference across the third reactor, and
the two or more voltage differences include the first voltage difference, the second voltage difference, and the third voltage difference.

3. The power conversion device according to claim 2, wherein
the control section calculates
a first value on a basis of the first voltage difference, the third voltage difference, and the first voltage, and
a second value on a basis of the second voltage difference, the third voltage difference, and the second voltage, and
the control section controls the operations of the fifth switching element and the sixth switching element on a basis of the first value and the second value.

4. The power conversion device according to claim 1, wherein
the two or more reactors include a first reactor provided in the first path and a second reactor provided in the second path,
the control section calculates a first voltage difference across the first reactor and a second voltage difference across the second reactor, and
the two or more voltage differences include the first voltage difference and the second voltage difference.

5. The power conversion device according to claim 4, wherein
the control section calculates
a first value on a basis of the first voltage difference and the first voltage, and
a second value on a basis of the second voltage difference and the second voltage, and
the control section controls the operations of the fifth switching element and the sixth switching element on a basis of the first value and the second value.

6. The power conversion device according to claim 1, wherein
the two or more reactors include a first reactor provided in the first path and a third reactor provided in the third path,
the control section calculates a first voltage difference across the first reactor and a third voltage difference across the third reactor, and
the two or more voltage differences include the first voltage difference and the third voltage difference.

7. The power conversion device according to claim 6, wherein
the control section calculates
a first value on a basis of the first voltage difference, the third voltage difference, and the first voltage, and
a second value on a basis of the third voltage difference and the second voltage, and
the control section controls the operations of the fifth switching element and the sixth switching element on a basis of the first value and the second value.

8. The power conversion device according to claim 1, wherein the control section calculates a duty ratio in the fifth switching element and the sixth switching element on a basis of the two or more voltage differences, the first voltage, and the second voltage.

9. The power conversion device according to claim 1, wherein
the control section calculates
a first load current flowing to the first output terminal on a basis of a current flowing from the first node to the low-pass filter,
a second load current flowing to the second output terminal on a basis of a current flowing from the second node to the low-pass filter, and
a current difference that is a difference between the first load current and the second load current, and
the control section controls operations of the first switching element, the second switching element, the third switching element, and the fourth switching element on a basis of the current difference.

10. The power conversion device according to claim 9, wherein the control section calculates
the first load current by estimating a current flowing to the first capacitor using a predetermined periodic function, and the second load current by estimating a current flowing to the second capacitor using the predetermined periodic function.

11. The power conversion device according to claim 10, wherein the control section estimates an amplitude of the current flowing to the first capacitor on a basis of an effective value of the first voltage, and an amplitude of the current flowing to the second capacitor on a basis of an effective value of the second voltage.

* * * * *